(12) United States Patent
Morimoto

(10) Patent No.: US 7,576,677 B2
(45) Date of Patent: Aug. 18, 2009

(54) PIPELINE A/D CONVERTER CONVERTING ANALOG SIGNAL TO DIGITAL SIGNAL

(75) Inventor: Yasuo Morimoto, Chiyoda-ku (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 146 days.

(21) Appl. No.: 11/806,422

(22) Filed: May 31, 2007

(65) Prior Publication Data

US 2007/0290915 A1    Dec. 20, 2007

(30) Foreign Application Priority Data

May 31, 2006   (JP)   .............................. 2006-151603

(51) Int. Cl.
*H03M 1/34*   (2006.01)
(52) U.S. Cl. ...................................... 341/162; 341/155
(58) Field of Classification Search ................ 341/162, 341/120, 118, 155
See application file for complete search history.

(56) References Cited

U.S. PATENT DOCUMENTS

| 7,187,310 B2 * | 3/2007 | El-Sankary et al. ......... 341/120 |
| 2007/0090984 A1 * | 4/2007 | Lu et al. ..................... 341/155 |
| 2008/0018508 A1 * | 1/2008 | Filipovic et al. ............ 341/118 |

FOREIGN PATENT DOCUMENTS

JP    2005-252326 A    9/2005

* cited by examiner

*Primary Examiner*—Rexford N Barnie
*Assistant Examiner*—Joseph Lauture
(74) *Attorney, Agent, or Firm*—Buchanan Ingersoll & Rooney PC

(57) ABSTRACT

A first stage of a pipeline A/D converter is configured to output a sub analog signal at a level within a predetermined output voltage range even if a level of an input analog signal exceeds a predetermined input voltage range. Therefore, as compared with an example where a limiter circuit is provided on an input side of each stage, a pipeline A/D converter occupying a small area, consuming low power, and having small errors can be provided.

14 Claims, 16 Drawing Sheets

US 7,576,677 B2

PIPELINE A/D CONVERTER CONVERTING ANALOG SIGNAL TO DIGITAL SIGNAL

BACKGROUND OF THE INVENTION

1. Field of the Invention

The present invention relates to a pipeline A/D converter, and more particularly to a pipeline A/D converter obtained by cascading a plurality of low-bit A/D conversion stages (hereinafter, simply referred to as "stage"), for obtaining a final digital signal based on a digital signal obtained in each stage.

2. Description of the Background Art

Development in system LSI technology in recent years has enabled mounting of a large-scale system on a single LSI. A data converter is indispensable for input/output of an analog signal in such a system LSI. In the system LSI, as various types of information such as a sensor or image signal or a radio signal have more often been input, a plurality of A/D converters are often mounted on a single system LSI. Under such circumstances, pipeline A/D converters have increasingly been used in recent years as circuits excellent in terms of occupied area and power consumption. Meanwhile, further reduction in the area or lower power consumption is required also in pipeline A/D converters excellent in terms of occupied area and power consumption. Here, a shared amplifier configuration has been proposed as measures to meet such demands (see, for example, Japanese Patent Laying-Open No. 2005-252326).

According to the shared amplifier configuration, with attention being paid to the fact that an amplifier in a general pipeline A/D converter operates during only half of one cycle, (1) the amplifier is shared between two adjacent pipeline stages, or (2) two sets of capacitors are provided to perform an interleaved operation so that the amplifier is shared by the two sets of capacitors.

In the case of (1), the amplifier requiring largest area in the pipeline stage is shared by two stages so that the area can significantly be reduced, and efficiency in use of the amplifier is doubled so that power consumption can be lowered. Meanwhile, in the case of (2), though disadvantageous in terms of the area because of provision of two sets of capacitors, an operating time of the amplifier can be doubled so that a settling time required in the amplifier is significantly reduced, power required in the amplifier is significantly lowered, and the area of the amplifier can also be made smaller.

It is likely that the shared amplifier configuration attaining such features will further increasingly be employed in the future, however, no period for resetting the amplifier is available in the pipeline stage adopting the shared amplifier configuration. Accordingly, a large potential difference between differential input terminals of the amplifier, caused by excessive input, is taken over for a plurality of cycles, which results in a great error during the operation over several cycles. Mechanism of this phenomenon is as described below.

The pipeline stage constituting the pipeline A/D converter includes a switched capacitor circuit. With the effect of negative feedback and artificial ground of the amplifier, a sampled analog signal Vin is multiplied by a specific multiplier $\alpha$ ($\alpha$ is typically set to 2 or 4), and a reference voltage Vr=k·Vref (k=0, ±1, ... ±($\alpha$−1); Vref represents a reference voltage determining an input range) selected in accordance with a level of analog signal Vin is subtracted (Vout=kVin−Vr).

If signal Vin at such an excessively high level as exceeding Vref is input in performing this calculation, a voltage represented by Vout=kVin−Vr may not be output, because the output range of the amplifier is restricted by a power supply voltage Vdd. Here, the amplifier cannot make transition to a state of artificial ground, and a large potential difference is created between the differential input terminals of the amplifier.

In order to solve this problem, it is possible to provide a limiter circuit for restricting an input voltage. The limiter circuit is mainly constituted of a comparator and a switch, however, slight deviation in accuracy of the comparator or in a reference potential is doubled or quadrupled per one stage, which results in a value significantly deviating from the input range after several stages. Thus, the possibility of overflow again arises. Accordingly, a large number of limiter circuits are required in order to avoid a great error. Meanwhile, if safety is to be ensured, a limiter circuit is required for each stage and the area therefor is very large. In addition, as a delay path is inserted in a signal path, speed characteristic of a circuit preceding the limiter circuit should be improved and increase in current consumption results.

SUMMARY OF THE INVENTION

Therefore, an object of the present invention is to provide a pipeline A/D converter occupying a small area, consuming low power, and having small errors.

A pipeline A/D converter according to the present invention is directed to a pipeline A/D converter converting an analog signal to a digital signal, that includes first to Nth (N is an integer not smaller than 2) stages that are cascaded, and an error correction circuit generating the digital signal based on sub digital signals output from the first to Nth stages. The first stage includes a first sub ADC converting the analog signal to the sub digital signal and providing the sub digital signal to the error correction circuit and a first sub DAC outputting to the second stage, a sub analog signal at a level in accordance with the analog signal and the sub digital signal generated in the first sub ADC. Each of the second to N−1th stages includes a second sub ADC converting the sub analog signal provided from a preceding stage to the sub digital signal and providing the sub digital signal to the error correction circuit and a second sub DAC outputting to a subsequent stage, a sub analog signal at a level in accordance with the sub analog signal provided from the preceding stage and the sub digital signal generated in the second sub ADC. The Nth stage includes a third sub ADC converting the sub analog signal provided from the preceding stage to the sub digital signal and providing the sub digital signal to the error correction circuit. The first sub DAC is configured to output the sub analog signal at a level within a predetermined output voltage range even if the level of the analog signal exceeds a predetermined input voltage range.

In the pipeline A/D converter according to the present invention, the first sub DAC in the first stage is configured to output the sub analog signal at a level within the predetermined output voltage range even if the level of the analog signal exceeds the predetermined input voltage range. Therefore, as compared with an example where a limiter circuit is provided on the input side of each stage, the pipeline A/D converter occupying a small area, consuming low power, and having small errors can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
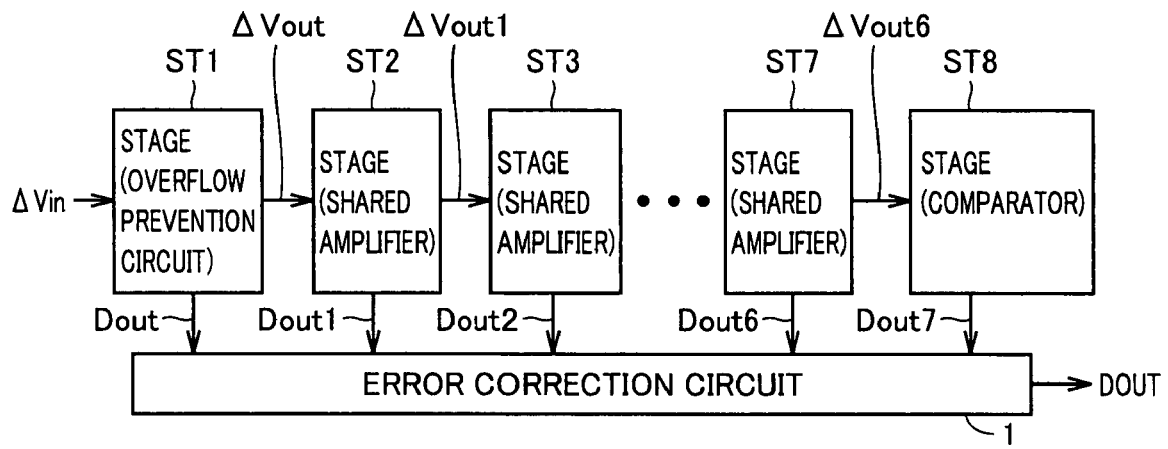
FIG. 1 is a block diagram showing a configuration of a pipeline A/D converter according to a first embodiment of the present invention.

FIG. 1 is a block diagram showing a configuration of a pipeline A/D converter according to a first embodiment of the present invention. In FIG. 1, the pipeline A/D converter includes eight stages ST1 to ST8 that are cascaded and an error correction circuit 1.

First stage ST1 receives an analog signal $\Delta$Vin to be A/D converted. Stage ST1 generates a digital signal Dout of 3.25 bits (any of 0000 to 1000) based on input analog signal $\Delta$Vin, and provides generated digital signal Dout to error correction circuit 1. In addition, stage ST1 generates an analog signal $\Delta$Vout at a level in accordance with input analog signal $\Delta$Vin and generated digital signal Dout, and provides generated analog signal $\Delta$Vout to next stage ST2. Moreover, stage ST1 includes an overflow prevention circuit maintaining analog signal $\Delta$Vout within a normal range even if the level of input analog signal $\Delta$Vin exceeds a prescribed input voltage range.

Second stage ST2 generates a digital signal Dout1 of 1.5 bit (any of 00 to 10) based on analog signal $\Delta$Vout from preceding stage ST1 and provides generated digital signal Dout1 to error correction circuit 1. In addition, stage ST2 generates an analog signal $\Delta$Vout1 at a level in accordance with input analog signal $\Delta$Vout and generated digital signal Dout1, and provides generated analog signal $\Delta$Vout1 to next stage ST3. Stage ST2 adopts what is called a lateral shared amplifier configuration. Each of third to seventh stages ST3 to ST7 is configured similarly to stage ST2.

Last stage ST8 includes a comparator, generates a digital signal Dout7 of 2 bits (any of 00 to 11) based on an analog signal $\Delta$Vout6 from preceding stage ST7, and provides generated digital signal Dout7 to error correction circuit 1. Error correction circuit 1 outputs a last digital signal DOUT based on digital signals Dout to Dout7 output from stages ST1 to ST8.

Figure 2:
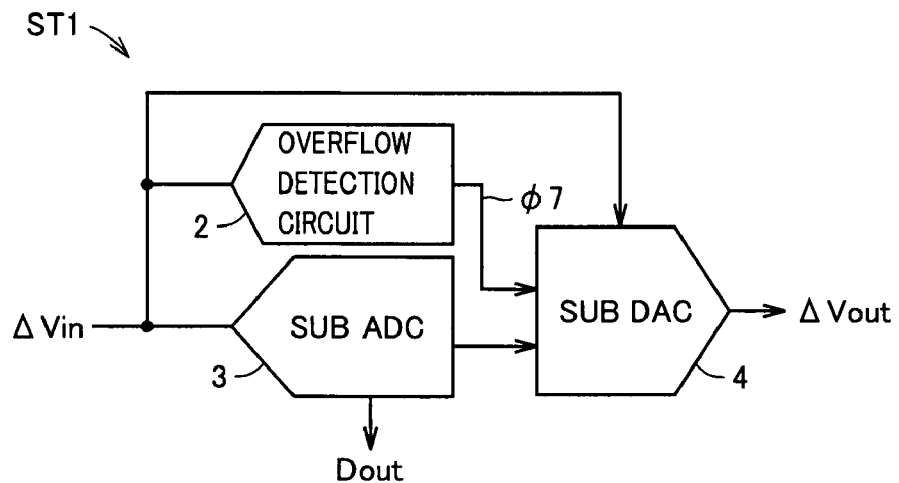
FIG. 2 is a block diagram showing a configuration of a stage ST1 shown in FIG. 1.

FIG. 2 is a block diagram showing a configuration of first stage ST1. In FIG. 2, stage ST1 includes an overflow detection circuit 2, a sub ADC (sub A/D converter) 3, and a sub DAC (sub D/A converters 4. When the level of input analog signal $\Delta$Vin is excessively high, overflow detection circuit 2 sets a signal $\phi$7 to "H" level representing an activation level. Sub ADC 3 converts input analog signal $\Delta$Vin to digital signal Dout of 3.25 bits and provides the digital signal to error correction circuit 1, as well as provides a switch signal in accordance with the level of analog signal $\Delta$Vin to sub DAC 4. Sub DAC 4 generates analog signal $\Delta$Vout based on input analog signal Vin and the switch signal from sub ADC 3, and provides generated analog signal $\Delta$Vout to next stage ST2. In addition, when the level of analog signal Vin is excessively high and signal $\phi$7 is set to "H", sub DAC 4 sets analog signal $\Delta$Vout to 0 level.

Figure 3:
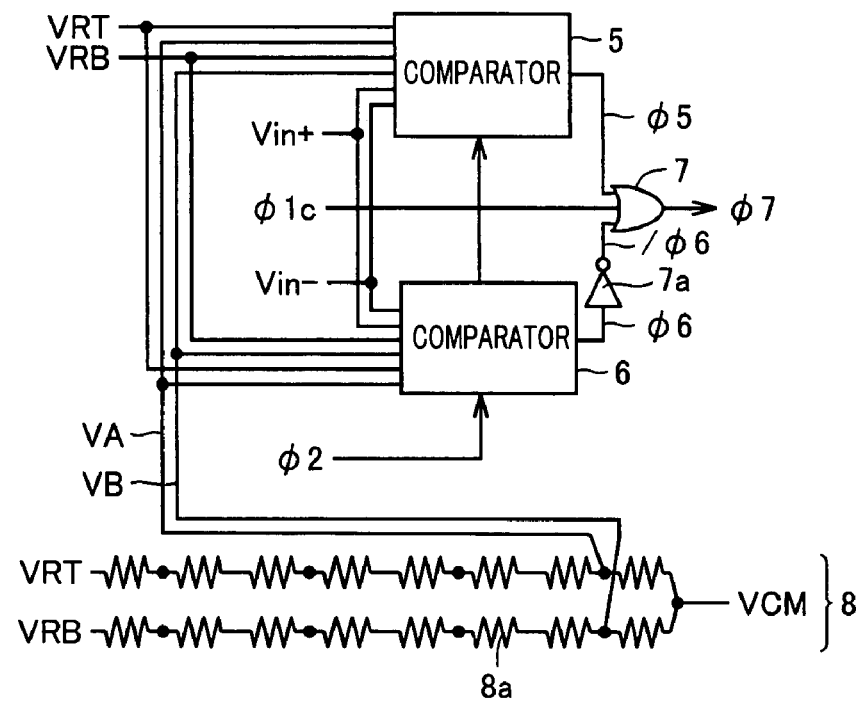
FIG. 3 is a circuit block diagram showing a configuration of an overflow detection circuit shown in FIG. 2.

FIG. 3 is a circuit block diagram showing a configuration of overflow detection circuit 2. In FIG. 3, overflow detection circuit 2 includes comparators 5 and 6, an OR gate 7, an inverter 7a, and a reference voltage generation circuit 8. Reference voltage generation circuit 8 includes sixteen resistance elements 8a connected in series. As these resistance elements 8a have equal resistance values, a reference voltage VRT-VRB is divided to generate reference voltages VA=(VRT-VRB)×9/16, VB=(VRT-VRB)×7/16, and VCM=(VRT-VRB)/2.

Comparator 5 compares input analog signal $\Delta Vin=V_{in+}-V_{in-}$ with a reference voltage $VRT-VRB+VA-VB=(VRT-VRB)\times 9/8$, which represents the upper limit. If relation of $V_{in+}-V_{in-}>(VRT-VRB)\times 9/8$ is satisfied, a signal $\phi 5$ is set to "H" level, whereas if relation of $V_{in+}-V_{in-}<(VRT-VRB)\times 9/8$ is satisfied, signal $\phi 5$ is set to "L" level.

Comparator 6 compares input analog signal $\Delta Vin=V_{in+}-V_{in-}$ with a reference voltage $VRB-VRT+VB-VA=(VRB-VRT)\times 9/8$, which represents the lower limit. If relation of $V_{in+}-V_{in-}<(VRB-VRT)\times 9/8$ is satisfied, a signal $\phi 6$ is set to "H" level, whereas if relation of $V_{in+}-V_{in-}>(VRB-VRT)\times 9/8$ is satisfied, signal $\phi 6$ is set to "L" level.

Inverter 7a receives output signal $\phi 6$ of comparator 6 and outputs an inverted signal $/\phi 6$ thereof OR gate 7 receives output signal $\phi 5$ of comparator 5, output signal $/\phi 6$ of inverter 7a and a clock signal $\phi 1c$, and outputs a signal $\phi 7$. When at least one of signals $\phi 5$, $/\phi 6$ and $\phi 1c$ is at "H" level, signal $\phi 7$ is set to "H" level.

Figure 4:
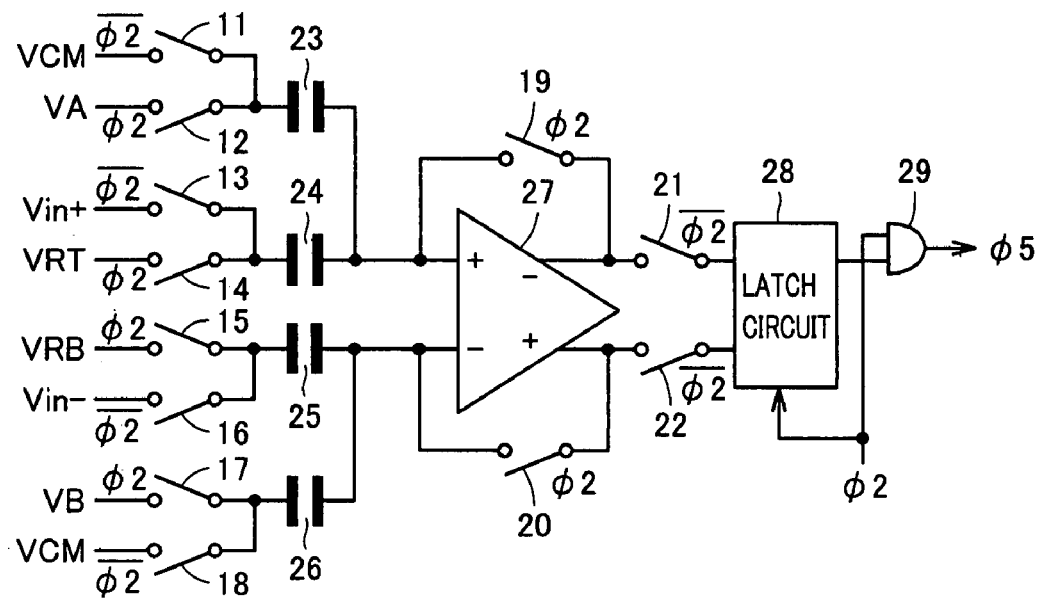
FIG. 4 is a circuit block diagram showing a configuration of a comparator shown in FIG. 3.

FIG. 4 is a circuit block diagram showing a configuration of comparator 5. In FIG. 4, comparator 5 includes switches 11 to 22, capacitors 23 to 26, a differential amplifier 27, a latch circuit 28, and an AND gate 29. One terminals of switches 11 to 18 receive voltage signals VCM, VA, $V_{in+}$, VRT, VRB, $V_{in-}$, VB, and VCM, respectively. The other terminals of switches 11, 13, 15, and 17 are connected to one terminals of capacitors 23 to 26, respectively. The other terminals of switches 12, 14, 16, and 18 are connected to one terminals of capacitors 23 to 26, respectively.

The other terminals of capacitors 23 and 24 are both connected to a + input terminal of differential amplifier 27. The other terminals of capacitors 25 and 26 are both connected to a − input terminal of differential amplifier 27. Switch 19 is connected between the + input terminal and a − output terminal of differential amplifier 27. Switch 20 is connected between the − input terminal and a + output terminal of differential amplifier 27. The + output terminal and the − output terminal of differential amplifier 27 are connected to latch circuit 28, with switches 21 and 22 being interposed, respectively. AND gate 29 outputs an AND signal of clock signal $\phi 2$ and an output signal of latch circuit 28 as output signal $\phi 5$ of comparator 5.

During a period in which clock signal $\phi 2$ is at "H" level (clock signal $/\phi 2$ is at "L" level), switches 12, 14, 15, 17, 19, and 20 are conducting, while remaining switches 11, 13, 16, 18, 21, and 22 are non-conducting. A voltage at the + input terminal and a voltage at the − input terminal of differential amplifier 27 are denoted as Vx1 and Vx2 respectively. Here, as input and output terminals of differential amplifier 27 are short-circuited through switches 19 and 20, an operation is such that the input voltage and the output voltage of differential amplifier 27 match with each other, namely, relation of Vx1=Vx2=VAZ is satisfied. VAZ is referred to as an auto zero potential that is obtained when the input and output terminals of differential amplifier 27 are short-circuited. Therefore, assuming that a capacitance value of each of capacitors 23 to 27 is denoted as C, charges Q1=C(VA−VAZ), Q2=C(VRT−VAZ), Q3=C(VRB−VAZ), and Q4=C(VB−VAZ) are charged to capacitors 23 to 26, respectively.

During a period in which clock signal $\phi 2$ is at "L" level (clock signal $/\phi 2$ is at "H" level), switches 11, 13, 16, 18, 21, and 22 are conducting, while remaining switches 12, 14, 15, 17, 19, and 20 are non-conducting. Here, the potential at one terminals of capacitors 23 and 24 varies, however, the other terminals of capacitors 23 and 24 enter a high impedance state. Therefore, charges in capacitors 23 and 24 are stored, and relation of $Q1+Q2=C(VCM-Vx1)+C(V_{in+}-Vx1)=C(VA-VAZ)+C(VRT-VAZ)$ is satisfied. Similarly, charges in capacitors 25 and 26 are stored, and relation of $Q3+Q4=C(VCM-Vx2)+C(V_{in-}-Vx2)=C(VRB-VAZ)+C(VB-VAZ)$ is satisfied. Based on these expressions, relation of $Vx1=\{(V_{in+}+VCM)-(VRT+VA)\}/2+VAZ$ and $Vx2=\{(V_{in-}+VCM)-(VRB+VB)\}/2+VAZ$ is satisfied.

Here, assuming that a voltage at the + output terminal and a voltage at the output terminal of differential amplifier 27 are denoted as Vy1 and Vy2 respectively and an amplification ratio is denoted as A, relation of $Vy1-Vy2=A(Vx1-Vx2)=A\{(V_{in+}-V_{in-})-(VRT-VRB+VA-VB)\}/2$ is satisfied. Therefore, a difference between $(V_{in+}-V_{in-})$ and $(VRT-VRB+VA-VB)=(VRT-VRB)\times 9/8$ is amplified by differential amplifier 27, whereby Vy1 attains to "H" level or "L" level while Vy2 attains to "L" level or "H" level. Latch circuit 28 takes in the level of the signal provided through switch 21 during a period in which clock signal $\phi 2$ is at "L" level, and outputs the taken signal during a period in which clock signal $\phi 2$ is at "H" level.

Ultimately, when clock signal $\phi 2$ is at "H" level and relation of $V_{in+}-V_{in-}>(VRT-VRB)\times 9/8$ is satisfied, signal $\phi 5$ is set to "H" level. When clock signal $\phi 2$ is at "H" level and relation of $V_{in+}-V_{in-}<(VRT-VRB)\times 9/8$ is satisfied, signal $\phi 5$ is set to "L" level. When clock signal $\phi 2$ is at "L" level, signal $\phi 5$ is constantly at "L" level.

Comparator 6 is configured similarly to comparator 5. It is noted that reference voltages VB, VRB, VRT, and VA are input to one terminals of switches 12, 14, 15, and 17, instead of reference voltages VA, VRT, VRB, and VB.

Figure 5:
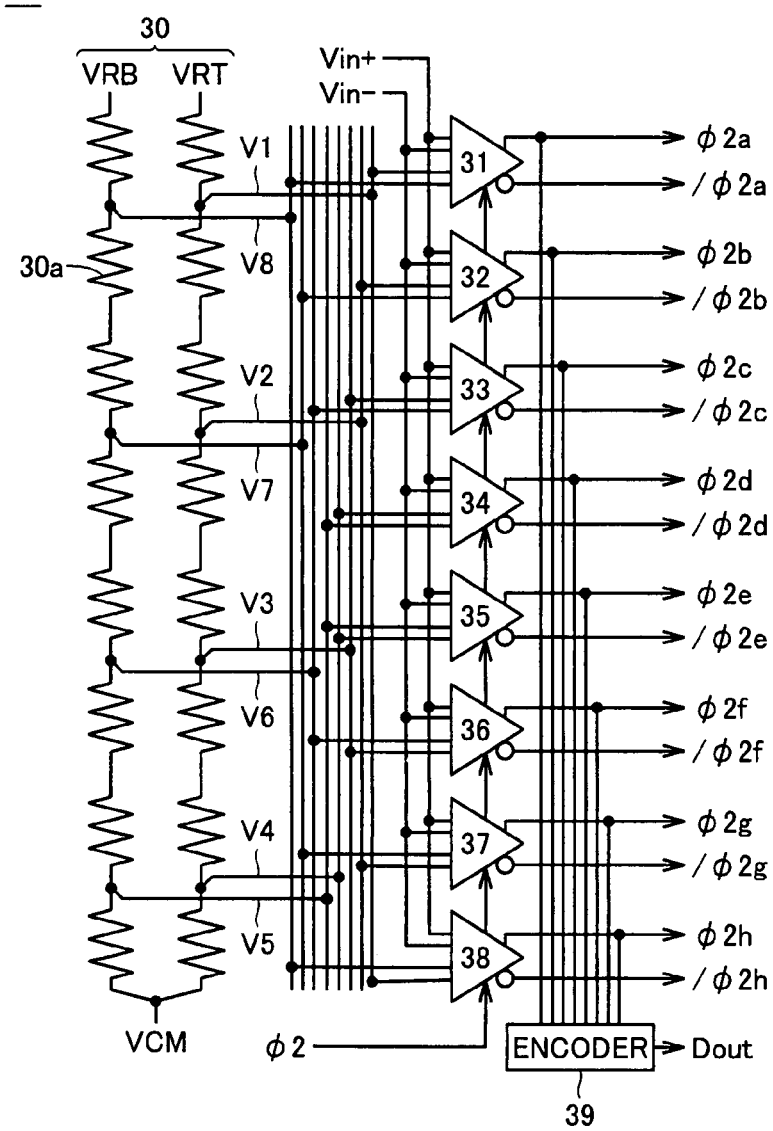
FIG. 5 is a circuit block diagram showing a configuration of a sub ADC shown in FIG. 2.

FIG. 5 is a circuit block diagram showing a configuration of sub ADC 3. In FIG. 5, sub ADC 3 includes a reference voltage generation circuit 30, comparators 31 to 38, and an encoder 39. Reference voltage generation circuit 30 includes sixteen resistance elements 30a connected in series. A reference voltage $VRT-VRB=\Delta Vref$ is divided to generate reference voltages V1 to V8. Sixteen resistance elements 30a have equal resistance values.

Comparators 31 to 38 are activated while clock signal $\phi 2$ is at "H" level. Comparator 31 compares analog signal $V_{in+}-V_{in-}$ with reference voltage $V1-V8=\Delta Vref\times 7/8$. If relation of $V_{in+}-V_{in-}>\Delta Vref\times 7/8$ is satisfied, signals $\phi 2a$ and $/\phi 2a$ are set to "H" level and "L" level respectively, whereas if relation of $V_{in+}-V_{in-}<\Delta Vref\times 7/8$ is satisfied, signals $\phi 2a$ and $/\phi 2a$ are set to "L" level and "H" level respectively. Comparator 32 compares analog signal $V_{in+}-V_{in-}$ with reference voltage $V2-V7=\Delta Vref\times 5/8$. If relation of $V_{in+}-V_{in-}>\Delta Vref\times 5/8$ is satisfied, signals $\phi 2b$ and $/\phi 2b$ are set to "H" level and "L" level respectively, whereas if relation of $V_{in+}-V_{in-}<\Delta Vref\times 5/8$ is satisfied, signals $\phi 2b$ and $/\phi 2b$ are set to "L" level and "H" level respectively.

Comparator 33 compares analog signal $V_{in+}-V_{in-}$ with reference voltage $V3-V6=\Delta Vref\times 3/8$. If relation of $V_{in+}-V_{in-}>\Delta Vref\times 3/8$ is satisfied, signals $\phi 2c$ and $/\phi 2c$ are set to "H" level and "L" level respectively, whereas if relation of $V_{in+}-V_{in-}<\Delta Vref\times 3/8$ is satisfied, signals $\phi 2c$ and $/\phi 2c$ are set to "L" level and "H" level respectively. Comparator 34 compares analog signal $V_{in+}-V_{in-}$ with reference voltage $V4-V5=\Delta Vref/8$. If relation of $V_{in+}-V_{in-}>\Delta Vref/8$ is satisfied, signals $\phi 2d$ and $/\phi 2d$ are set to "H" level and "L" level respectively, whereas if relation of $V_{in+}-V_{in-}<\Delta Vref/8$ is satisfied, signals $\phi 2d$ and $/\phi 2d$ are set to "L" level and "H" level respectively.

Comparator 35 compares analog signal $V_{in+}-V_{in-}$ with reference voltage $V5-V4=-\Delta Vref/8$. If relation of $V_{in+}-V_{in-}>-\Delta Vref/8$ is satisfied, signals $\phi 2e$ and $/\phi 2e$ are set to "H" level and "L" level respectively, whereas if relation of $V_{in+}-V_{in-}<-\Delta Vref/8$ is satisfied, signals $\phi 2e$ and $/\phi 2e$ are set to "L" level and "H" level respectively. Comparator 36 compares analog signal $V_{in+}-V_{in-}$ with reference voltage $V6-V3=-\Delta Vref \times 3/8$. If relation of $V_{in+}-V_{in-}>-\Delta Vref \times 3/8$ is satisfied, signals ϕ2f and /ϕ2f are set to "H" level and "L" level respectively, whereas if relation of $V_{in+}-V_{in-}<-\Delta Vref \times 3/8$ is satisfied, signals ϕ2f and /ϕ2f are set to "L" level and "H" level respectively.

Comparator 37 compares analog signal $V_{in+}-V_{in-}$ with reference voltage $V7-V2=-\Delta Vref \times 5/8$. If relation of $V_{in+}-V_{in-}>-\Delta Vref \times 5/8$ is satisfied, signals ϕ2g and /ϕ2g are set to "H" level and "L" level respectively, whereas if relation of $V_{in+}-V_{in-}<-\Delta Vref \times 5/8$ is satisfied, signals ϕ2g and /ϕ2g are set to "L" level and "H" level respectively. Comparator 38 compares analog signal $V_{in+}-V_{in-}$ with reference voltage $V8-V1=-\Delta Vref \times 7/8$. If relation of $V_{in+}-V_{in-}>-\Delta Vref \times 7/8$ is satisfied, signals ϕ2h and /ϕ2h are set to "H" level and "L" level respectively, whereas if relation of $V_{in+}-V_{in-}<-\Delta Vref \times 7/8$ is satisfied, signals ϕ2h and /ϕ2h are set to "L" level and "H" level respectively. When clock signal ϕ2 is at "L" level, output signals ϕ2a to ϕ2h and /ϕ2a to /ϕ2h of comparators 31 to 38 are fixed to "L" level. Encoder 39 generates digital signal Dout of 3.25 bits based on output signals ϕ2a to ϕ2h of comparators 31 to 38, and outputs generated digital signal Dout to error correction circuit 1.

Figure 6:
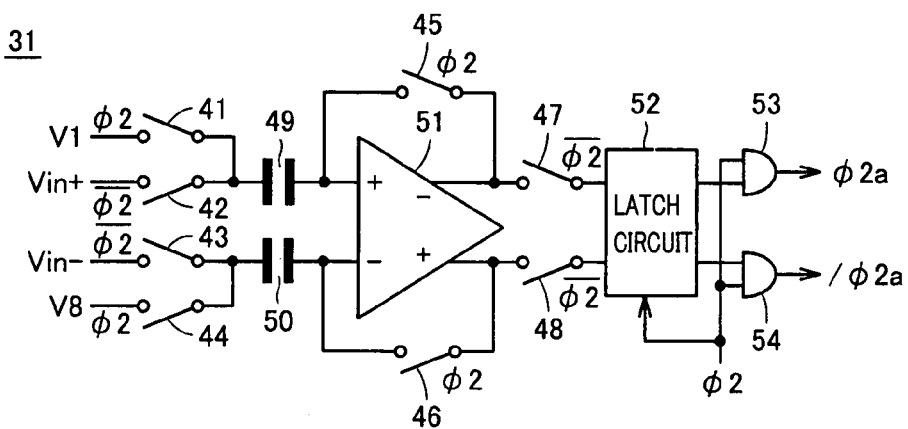
FIG. 6 is a circuit block diagram showing a configuration of a comparator shown in FIG. 5.

FIG. 6 is a circuit block diagram showing a configuration of comparator 31. In FIG. 6, comparator 31 includes switches 41 to 48, capacitors 49 and 50, a differential amplifier 51, a latch circuit 52, and AND gates 53 and 54. One terminals of switches 41 to 44 receive voltage signals V1, $V_{in+}$, $V_{in-}$, and V8, respectively. The other terminals of switches 41 and 43 are connected to one terminals of capacitors 49 and 50, respectively. The other terminals of switches 42 and 44 are connected to one terminals of capacitors 49 and 50, respectively.

The other terminals of capacitors 49 and 50 are connected to a + input terminal and a − input terminal of differential amplifier 51, respectively. Switch 45 is connected between the + input terminal and an − output terminal of differential amplifier 51. Switch 46 is connected between the − input terminal and an + output terminal of differential amplifier 51. The + output terminal and the − output terminal of differential amplifier 51 are connected to latch circuit 52, with switches 47 and 48 being interposed, respectively. AND gate 53 outputs an AND signal of clock signal ϕ2 and an output signal of latch circuit 52 as output signal ϕ2a of comparator 31. AND gate 54 outputs an AND signal of clock signal ϕ2 and an inverted output signal of latch circuit 52 as output signal /ϕ2a of comparator 31.

During a period in which clock signal ϕ2 is at "H" level (clock signal /ϕ2 is at "L" level), switches 41 and 44 to 46 are conducting, while remaining switches 42, 43, 47, and 48 are non-conducting. A voltage at the + input terminal and a voltage at the − input terminal of differential amplifier 51 are denoted as Vx1 and Vx2 respectively. Here, as input and output terminals of differential amplifier 51 are short-circuited through switches 45 and 46, an operation is such that the input voltage and the output voltage of differential amplifier 51 match with each other, namely, relation of Vx1=Vx2=VAZ is satisfied. VAZ is referred to as an auto zero potential that is obtained when the input and output terminals of differential amplifier 51 are short-circuited. Therefore, assuming that a capacitance value of each of capacitors 49 and 50 is denoted as C, charges Q1=C(V1−VAZ) are charged to capacitor 49 and charges Q2=C(V8−VAZ) are charged to capacitors 50.

During a period in which clock signal ϕ2 is at "L" level (clock signal /ϕ2 is at "H" level), switches 42, 43, 47, and 48 are conducting, while remaining switches 41 and 44 to 46 are non-conducting. Here, the potential at one terminal of capacitor 49 varies from V1 to $V_{in+}$, however, the other terminal of capacitor 49 enters a high impedance state. Then, charges in capacitor 49 are stored, and relation of Q1=C($V_{in+}$−Vx1)=C(V1−VAZ) is satisfied. Similarly, charges in capacitor 50 are stored, and relation of Q2=C($V_{in-}$−Vx2)=C(V8−VAZ) is satisfied. Based on these expressions, relation of Vx1=($V_{in+}$−V1)+VAZ and Vx2=($V_{in-}$−V8)+VAZ is satisfied.

Here, assuming that a voltage at the + output terminal and a voltage at the − output terminal of differential amplifier 51 are denoted as Vy1 and Vy2 respectively and an amplification ratio is denoted as A, relation of Vy1−Vy2=A(Vx1−Vx2)=A{($V_{in+}$−$V_{in-}$)−(V1−V8)} is satisfied. Therefore, a difference between ($V_{in+}$−$V_{in-}$) and (V1−V8) is amplified by differential amplifier 51, whereby Vy1 attains to "H" level or "L" level while Vy2 attains to "L" level or "H" level. Latch circuit 52 takes in the level of the signal provided through switches 47 and 48 during a period in which clock signal ϕ2 is at "L" level, and outputs the taken signal during a period in which clock signal ϕ2 is at "H" level.

Ultimately, when clock signal ϕ2 is at "H" level and relation of $V_{in+}-V_{in-}$>V1−V8 is satisfied, signals ϕ2a and /ϕ2a are set to "H" level and "L" level respectively. When clock signal ϕ2 is at "H" level and relation of $V_{in+}-V_{in-}$<V1−V8 is satisfied, signals ϕ2a and /ϕ2a are set to "L" level and "H" level respectively. When clock signal ϕ2 is at "L" level, signals ϕ2a and /ϕ2a are always at "L" level.

Each of comparators 32 to 38 is configured similarly to comparator 31. It is noted that reference voltages V2, V7; V3, V6; V4, V5; V5, V4; V6, V3; V7, V2; V8, V1 are input to one terminals of switches 41 and 44, instead of reference voltages V1, V8.

Figure 7:
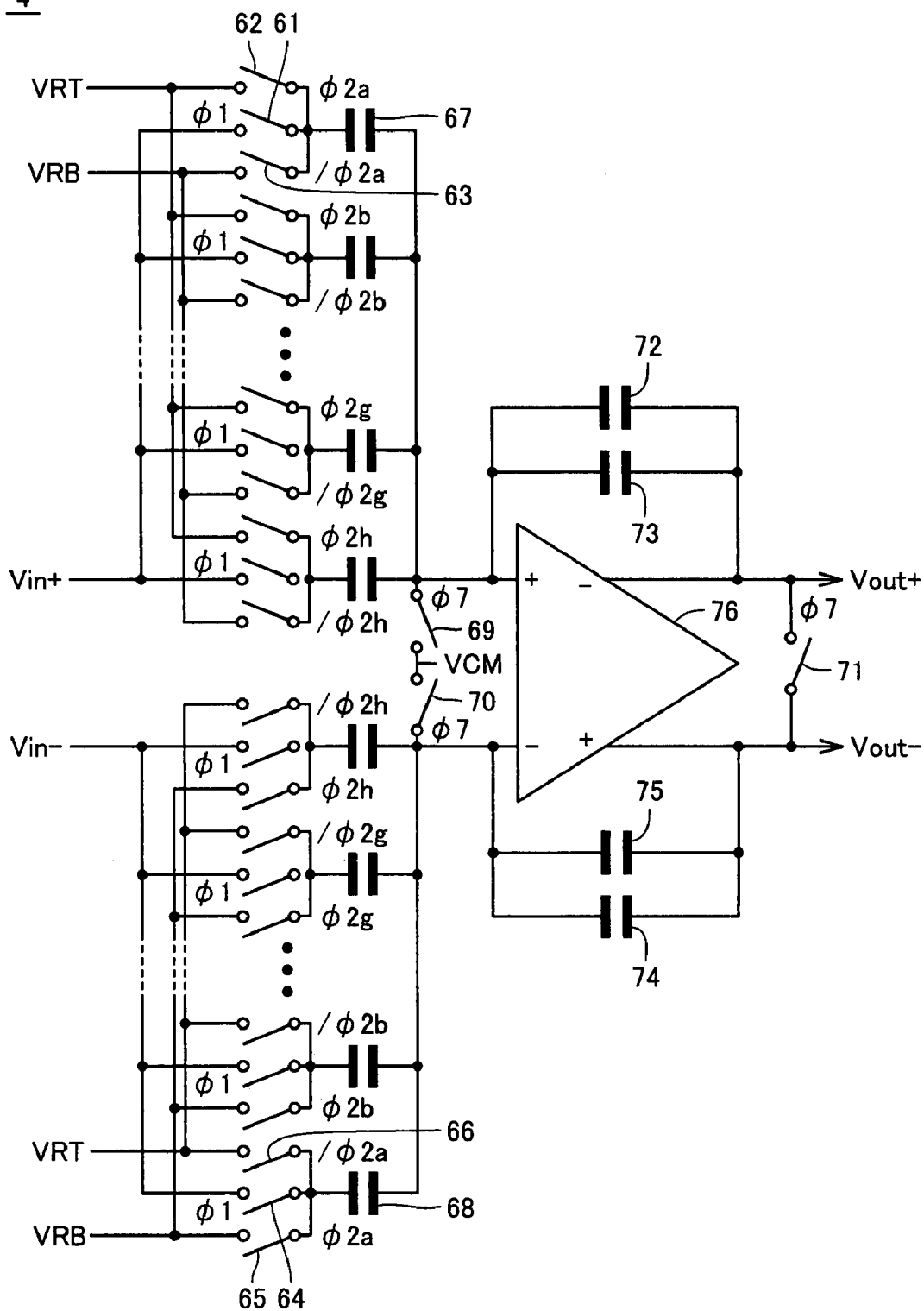
FIG. 7 is a circuit block diagram showing a configuration of a sub DAC shown in FIG. 2.

FIG. 7 is a circuit diagram showing a configuration of sub DAC 4. In FIG. 7, sub DAC 4 includes switches 61 to 66 and capacitors 67 and 68 provided in correspondence with each of comparators 31 to 38 in FIG. 5, switches 69 to 71, capacitors 72 to 75, and a differential amplifier 76.

One terminals of switches 61 to 63 receive voltage signals $V_{in+}$, VRT, and VRB respectively, and switches 61 to 63 have the other terminals connected to one terminal of capacitor 67. Capacitor 67 has the other terminal connected to a + input terminal of differential amplifier 76. Switch 61 conducts while a clock signal ϕ1 is at "H" level, and switches 62 and 63 conduct when output signals (in this case, ϕ2a and /ϕ2a) of each corresponding comparator (such as 31) are at "H" level.

One terminals of switches 64 to 66 receive voltage signals $V_{in-}$, VRB, and VRT respectively, and switches 64 to 66 have the other terminals connected to one terminal of capacitor 68. Capacitor 68 has the other terminal connected to a − input terminal of differential amplifier 76. Switch 64 conducts while clock signal ϕ1 is at "H" level, and switches 65 and 66 conduct when output signals (in this case, ϕ2a and /ϕ2a) of each corresponding comparator (such as 31) are at "H" level.

One terminals of switches 69 and 70 both receive reference voltage VCM, and switches 69 and 70 have the other terminals connected to the + input terminal and the − input terminal of differential amplifier 76 respectively. Switch 71 is connected between a + output terminal and a − output terminal of differential amplifier 76. Switches 69 to 71 conduct during a period in which signal ϕ7 is at "H" level.

Capacitors 72 and 73 are connected in parallel between the + input terminal and the − output terminal of differential amplifier 76. Capacitors 74 and 75 are connected in parallel between the − input terminal and the + output terminal of differential amplifier 76. Capacitors 67, 68 and 72 to 75 have equal capacitance values. Analog signals $V_{out+}$, $V_{out-}$ are output from the − output terminal and the + output terminal of differential amplifier 76 respectively. Here, relation of $\Delta \text{Vout}=V_{out+}-V_{out-}$ is satisfied.

Figure 8:
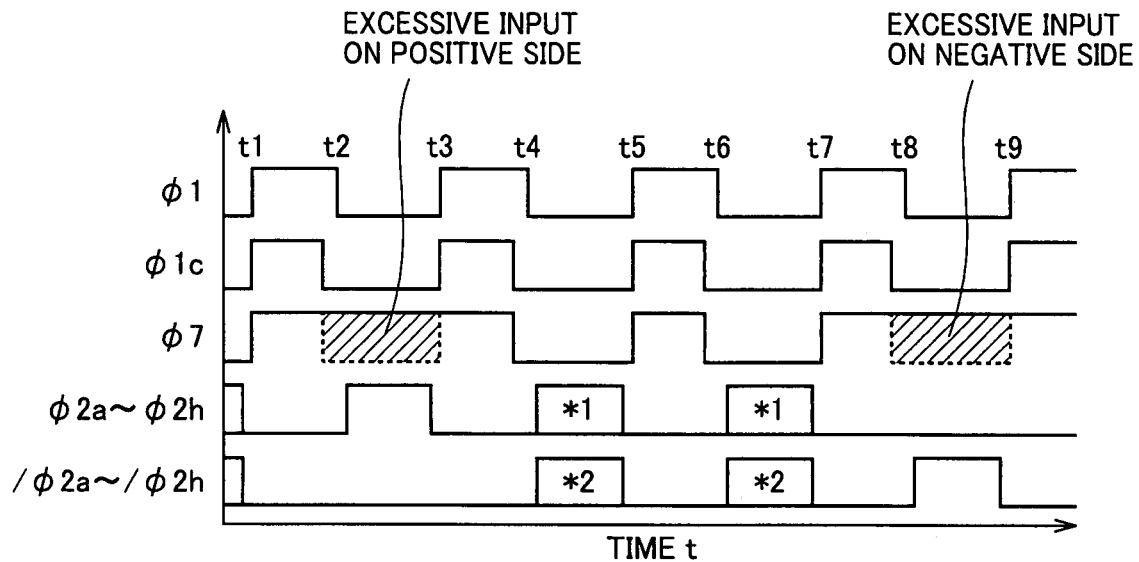
FIG. 8 is a time chart illustrating an operation of the sub DAC shown in FIG. 7.

FIG. 8 is a time chart illustrating an operation of sub DAC 4. In FIG. 8, clock signal φ1 is set to "H" level from time t1 to t2, from t3 to t4, from t5 to t6, from t7 to t8, and so on, and set to "L" level from time t2 to t3, from t4 to t5, from t6 to t7, from t8 to t9, and so on. Clock signal φ1c is a signal of which falling is earlier by a prescribed period than falling of clock signal φ1. Signal φ7 is an output signal of overflow detection circuit 2. Signals φ2a to φ2h and /φ2a to /φ2h are output signals of comparators 31 to 38.

When signal φ1 is raised to "H" level at time t1, signals φ1c and φ7 are also raised to "H" level. Thus, each switch 61, each switch 64, and switches 69 to 71 conduct, each capacitor 67 is charged with a differential voltage between signal $V_{in+}$ and reference voltage VCM, and each capacitor 68 is charged with a differential voltage between signal $V_{in-}$ and reference voltage VCM. In addition, when signal φ1 falls to "L" level at time t2, switches 61 and 64 become non-conducting.

Here, it is assumed that input signal $V_{in+}-V_{in-}$ overflows to the positive side. Then, even when signal φ1c attains to "L" level, signal φ7 is maintained at "H" level, signals φ2a to φ2h attain to "H" level, and signals /φ2a to /φ2h attain to "L" level. Thus, each switch 62, each switch 65, and switches 69 to 71 conduct, and output voltage $V_{out+}-V_{out-}$ of differential amplifier 76 is set to 0V.

When signal φ1 is raised to "H" level at time t3, signals φ1c and φ7 are also raised to "H" level. Thus, each switch 61, each switch 64, and switches 69 to 71 conduct, each capacitor 67 is charged with the differential voltage between signal $V_{in+}$ and reference voltage VCM, and each capacitor 68 is charged with the differential voltage between signal $V_{in-}$ and reference voltage VCM. In addition, when signal φ1 falls to "L" level at time t4, switches 61 and 64 become non-conducting.

Here, it is assumed that overflow of input signal $V_{in+}-V_{in-}$ does not occur. Then, when signal φ1c attains to "L" level, signal φ7 falls to "L" level, some of signals φ2a to φ2h and /φ2a to /φ2h attain to "H" level in accordance with the level of input signal $V_{in+}-V_{in-}$, and remaining signals attain to "L" level (this state is shown with *1 and *2 in FIG. 8). Thus, switches 69 to 71 become non-conducting, and switches 62, 63, 65, and 66 corresponding to the signal at "H" level out of signals φ2a to φ2h and /φ2a to /φ2h conduct. Thus, voltage $V_{out+}-V_{out-}$ at a level in accordance with the level of input signal $V_{in+}-V_{in-}$ is output.

Here, $V_{in+}-V_{in-}$ is denoted as $\Delta \text{Vin}$, $V_{out+}-V_{out-}$ is denoted as $\Delta \text{Vy}$, and VRT−VRB is denoted as $\Delta \text{Vref}$. If all of φ2a to φ2h are at "H" level, relation of $\Delta \text{Vy}=4\Delta \text{Vin}-4\Delta \text{Vref}$ is satisfied. Meanwhile, if only φ2b to φ2h among φ2a to φ2h are at "H" level, relation of $\Delta \text{Vy}=4\Delta \text{Vin}-3\Delta \text{Vref}$ is satisfied. In addition, if only φ2c to φ2h among φ2a to φ2h are at "H" level, relation of $\Delta \text{Vy}=4\Delta \text{Vin}-2\Delta \text{Vref}$ is satisfied. Moreover, if only φ2d to φ2h among φ2a to φ2h are at "H" level, relation of $\Delta \text{Vy}=4\Delta \text{Vin}-\Delta \text{Vref}$ is satisfied. Further, if only φ2e to φ2h among φ2a to φ2h are at "H" level, relation of $\Delta \text{Vy}=4\Delta \text{Vin}$ is satisfied.

In addition, if only φ2f to φ2h among φ2a to φ2h are at "H" level, relation of $\Delta \text{Vy}=4\Delta \text{Vin}+\Delta \text{Vref}$ is satisfied. Moreover, if only φ2g to φ2h among φ2a to φ2h are at "H" level, relation of $\Delta \text{Vy}=4\Delta \text{Vin}+2\Delta \text{Vref}$ is satisfied. Further, if only φ2h among φ2a to φ2h is at "H" level, relation of $\Delta \text{Vy}=4\Delta \text{Vin}+3\Delta \text{Vref}$ is satisfied. In addition, all of φ2a to φ2h are at "L" level, relation of $\Delta \text{Vy}=4\Delta \text{Vin}+4\Delta \text{Vref}$ is satisfied.

When signal φ1 is raised to "H" level at time t7, signals φ1c and φ7 are also raised to "H" level. Thus, each switch 61, each switch 64, and switches 69 to 71 conduct, each capacitor 67 is charged with the differential voltage between signal $V_{in+}$ and reference voltage VCM, and each capacitor 68 is charged with the differential voltage between signal $V_{in-}$ and reference voltage VCM. In addition, when signal φ1 falls to "L" level at time t8, switches 61 and 64 become non-conducting.

Here, it is assumed that input signal $V_{in+}-V_{in-}$ overflows to the negative side. Then, even when signal φ1c attains to "L" level, signal φ7 is maintained at "H" level, signals φ2a to φ2h attain to "L" level, and signals /φ2a to /φ2h attain to "H" level. Thus, each switch 63, each switch 66, and switches 69 to 71 conduct, and output voltage $V_{out+}-V_{out-}$ of differential amplifier 76 is set to 0V.

Figure 9:
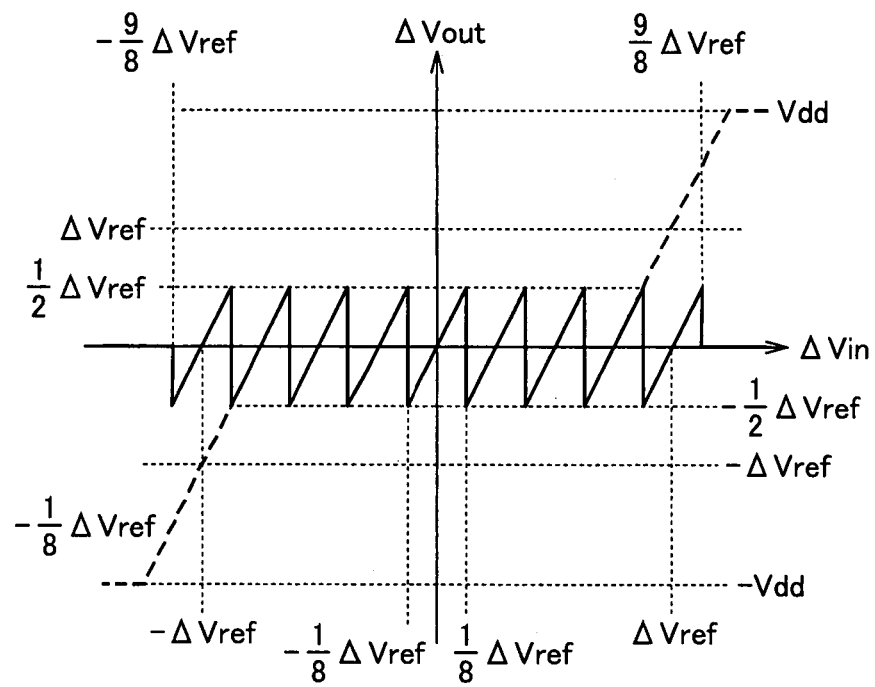
FIG. 9 illustrates a transfer function of stage ST1 shown in FIGS. 2 to 8.

FIG. 9 illustrates a transfer function of stage ST1. In FIG. 9, the abscissa represents $\Delta \text{Vin}=V_{in+}-V_{in-}$, and the ordinate represents $\Delta \text{Vout}=V_{out+}-V_{out-}$. In a section $0<\Delta \text{Vin}<\Delta \text{Vref}/8$, relation of $\Delta \text{Vout}=\Delta \text{Vin}\times 4$ is satisfied. In a section $\Delta \text{Vref}/8<\Delta \text{Vin}<\Delta \text{Vref}\times 3/8$, relation of $\Delta \text{Vout}=\Delta \text{Vin}\times 4-\Delta \text{Vref}$ is satisfied. In a section $\Delta \text{Vref}\times 3/8<\Delta \text{Vin}<\Delta \text{Vref}\times 5/8$, relation of $\Delta \text{Vout}=\Delta \text{Vin}\times 4-\Delta \text{Vref}\times 2$ is satisfied. In a section $\Delta \text{Vref}\times 5/8<\Delta \text{Vin}<\Delta \text{Vref}\times 7/8$, relation of $\Delta \text{Vout}=\Delta \text{Vin}\times 4-\Delta \text{Vref}\times 3$ is satisfied. In a section $\Delta \text{Vref}\times 7/8<\Delta \text{Vin}<\Delta \text{Vref}\times 9/8$, relation of $\Delta \text{Vout}=\Delta \text{Vin}\times 4-\Delta \text{Vref}\times 4$ is satisfied. In a section $\Delta \text{Vref}\times 9/8<\Delta \text{Vin}$, relation of $\Delta \text{Vout}=0$ is satisfied.

Thus, a curve representing the transfer function makes a turn from the positive side toward the negative side when $\Delta \text{Vin}$ attains to $\Delta \text{Vref}/8$, $\Delta \text{Vref}\times 3/8$, $\Delta \text{Vref}\times 5/8$, $\Delta \text{Vref}\times 7/8$, and $\Delta \text{Vref}\times 9/8$. $\Delta \text{Vref}/8$, $\Delta \text{Vref}\times 3/8$, $\Delta \text{Vref}\times 5/8$, and $\Delta \text{Vref}\times 7/8$ correspond to comparators 34, 33, 32, and 31 respectively, and $\Delta \text{Vref}\times 9/8$ corresponds to comparator 5.

In a section $0>\Delta \text{Vin}>-\Delta \text{Vref}/8$, relation of $\Delta \text{Vout}=\Delta \text{Vin}\times 4$ is satisfied. In a section $-\Delta \text{Vref}/8>\Delta \text{Vin}>-\Delta \text{Vref}\times 3/8$, relation of $\Delta \text{Vout}=\Delta \text{Vin}\times 4+\Delta \text{Vref}$ is satisfied. In a section $-\Delta \text{Vref}\times 3/8>\Delta \text{Vin}>-\Delta \text{Vref}\times 5/8$, relation of $\Delta \text{Vout}=\Delta \text{Vin}\times 4+\Delta \text{Vref}\times 2$ is satisfied. In a section $-\Delta \text{Vref}\times 5/8>\Delta \text{Vin}>-\Delta \text{Vref}\times 7/8$, relation of $\Delta \text{Vout}=\Delta \text{Vin}\times 4+\Delta \text{Vref}\times 3$ is satisfied. In a section $-\Delta \text{Vref}\times 7/8>\Delta \text{Vin}>-\Delta \text{Vref}\times 9/8$, relation of $\Delta \text{Vout}=\Delta \text{Vin}\times 4+\Delta \text{Vref}\times 4$ is satisfied. In a section $-\Delta \text{Vref}\times 9/8>\Delta \text{Vin}$, relation of $\Delta \text{Vout}=0$ is satisfied.

Thus, when viewed in a direction from 0 to $-\Delta \text{Vref}$, a curve representing the transfer function makes a turn from the negative side toward the positive side when $\Delta \text{Vin}$ attains to $-\Delta \text{Vref}/8$, $-\Delta \text{Vref}\times 3/8$, $-\Delta \text{Vref}\times 5/8$, $-\Delta \text{Vref}\times 7/8$, and $-\Delta \text{Vref}\times 9/8$. $-\Delta \text{Vref}/8$, $-\Delta \text{Vref}\times 3/8$, $-\Delta \text{Vref}\times 5/8$, and $-\Delta \text{Vref}\times 7/8$ correspond to comparators 35 to 38 respectively, and $-\Delta \text{Vref}\times 9/8$ corresponds to comparator 6.

A dotted line in FIG. 9 represents a transfer function of a first stage in a conventional pipeline A/D converter. In the conventional first stage, a digital signal of 2.75 bits has been generated using $-\Delta \text{Vref}\times 5/8$, $-\Delta \text{Vref}\times 3/8$, $-\Delta \text{Vref}/8$, $\Delta \text{Vref}/8$, $\Delta \text{Vref}\times 3/8$, and $\Delta \text{Vref}\times 5/8$ as reference voltages. The transfer function of the conventional first stage is the same as the transfer function of stage ST1 according to the first embodiment in the section $0<\Delta \text{Vin}<\Delta \text{Vref}\times 7/8$, however, if $\Delta \text{Vin}$ is higher than $\Delta \text{Vref}\times 7/8$, $\Delta \text{Vout}$ increases in proportion to $\Delta \text{Vin}$ and reaches power supply voltage Vdd. Meanwhile, the transfer function of the conventional first stage is the same as the transfer function of stage ST1 according to the first embodiment in the section $0>\Delta \text{Vin}>-\Delta \text{Vref}\times 7/8$, however, if $\Delta \text{Vin}$ is lower than $-\Delta \text{Vref}\times 7/8$, $\Delta \text{Vout}$ decreases in proportion to $\Delta \text{Vin}$ and reaches power supply voltage $-\text{Vdd}$. In other words, with the conventional first stage, if $\Delta \text{Vin}$ is higher than $\Delta \text{Vref}\times 7/8$ or lower than $-\Delta \text{Vref}\times 7/8$, $\Delta \text{Vout}$ exceeds the normal output voltage range.

In contrast, with stage ST1 according to the first embodiment, two more turning points of the transfer function are provided on each of the positive side and the negative side. In addition, if $\Delta \text{Vin}$ is higher than $\Delta \text{Vref}\times 9/8$ or lower than −ΔVref×9/8, output voltage ΔVout is set to 0V. Therefore, ΔVout is always accommodated in the normal output voltage range.

Figure 10:
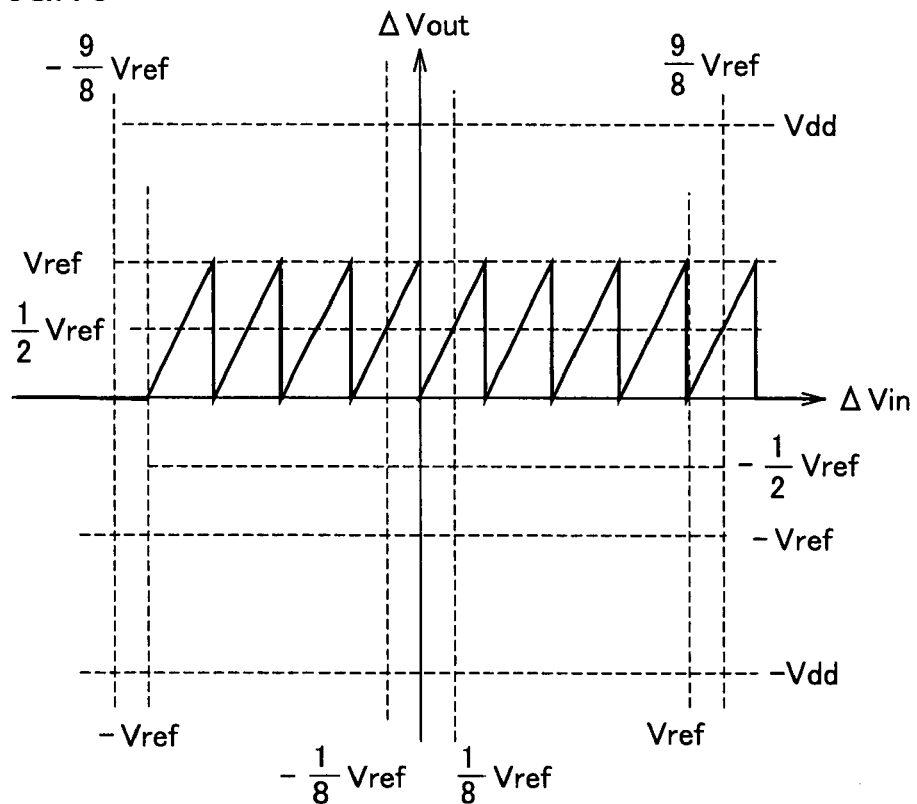
FIG. 10 illustrates an effect of stage ST1 shown in FIGS. 2 to 8.

FIG. 10 shows a transfer function when factors such as variation in manufacturing have led to comparison by comparators 5, 6, and 31 to 38 with error of +ΔVref/8. Even in such a case, ΔVout is accommodated in the normal output voltage range, namely in the range from −ΔVref to ΔVref. Therefore, malfunction originating from overflow does not occur.

Figure 11:
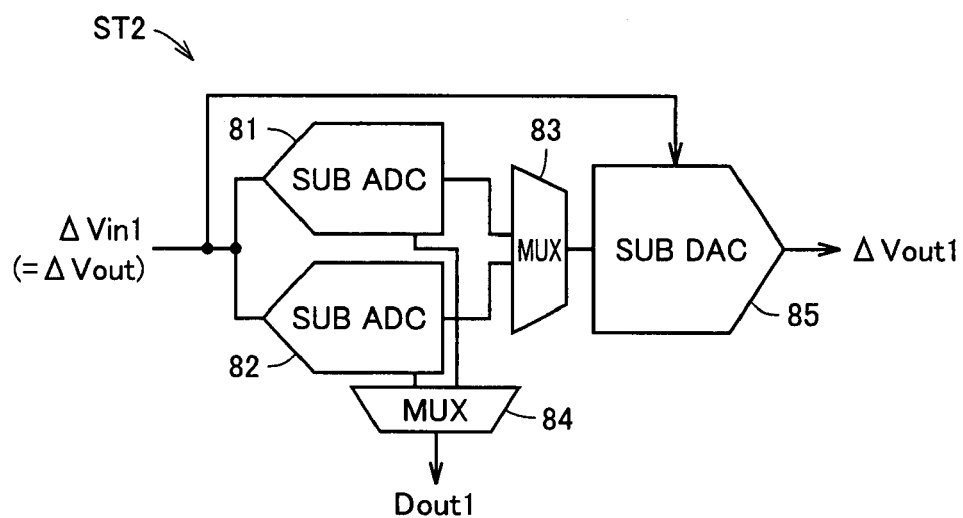
FIG. 11 is a block diagram showing a configuration of a stage ST2 shown in FIG. 1.

FIG. 11 is a block diagram showing a configuration of stage ST2. In FIG. 11, stage ST2 includes sub ADCs 81 and 82, multiplexers 83 and 84, and a sub DAC 85. Alternately activated for a prescribed period, sub ADCs 81 and 82 convert an analog signal ΔVin1=ΔVout provided from preceding stage ST1 to digital signal Dout1 of 1.5 bit and output a switch signal in accordance with the level of analog signal ΔVin. Multiplexer 83 alternately provides the switch signals generated in sub ADCs 81 and 82 to sub DAC 85. Multiplexer 84 alternately provides digital signals Dout1 generated in sub ADCs 81 and 82 to error correction circuit 1. Sub DAC 85 outputs analog signal ΔVout1 at a level in accordance with the level of analog signal ΔVin1 and the switch signals provided from sub ADCs 81 and 82.

Figure 12:
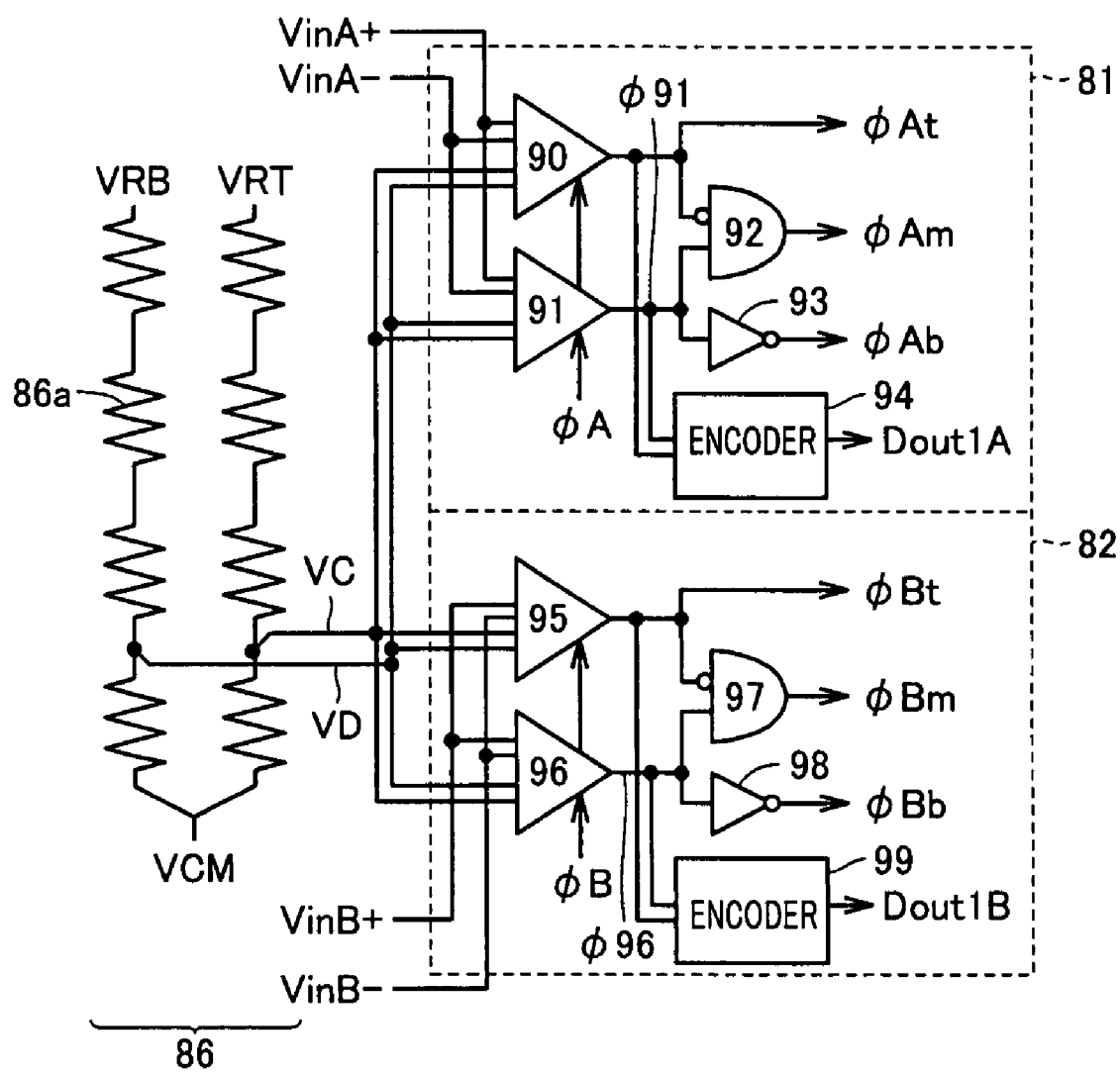
FIG. 12 is a circuit block diagram showing a configuration of a sub ADC shown in FIG. 11.

FIG. 12 is a circuit block diagram showing a configuration of sub ADCs 81 and 82. In FIG. 12, a reference voltage generation circuit 86 is provided in common to sub ADCs 81 and 82. Reference voltage generation circuit 86 includes eight resistance elements 86a connected in series. As resistance elements 86a have equal resistance values, reference voltage VRT−VRB is divided to generate reference voltage VC=(VRT−VRB)×5/8 and reference voltage VD=(VRT−VRB)×3/8.

Sub ADC 81 includes comparators 90 and 91, a logic gate 92, an inverter 93, and an encoder 94. Comparator 90 is activated during a period in which a clock signal φA is at "H" level. Comparator 90 compares analog signal $V_{inA+}-V_{inA-}$ provided from preceding stage ST1 with reference voltage VC−VD=(VRT−VRB)/4. If relation of $V_{inA+}-V_{inA-}$>(VRT−VRB)/4 is satisfied, a signal φAt is set to "H" level, whereas if relation of $V_{inA+}-V_{inA-}$<(VRT−VRB)/4 is satisfied, signal φAt is set to "L" level. Here, analog signal $V_{inA+}-V_{inA-}$ is the output signal $V_{out+}-V_{out-}$ of preceding stage ST1 during a period in which clock signal φA is at "H" level.

Comparator 91 is activated during a period in which clock signal φA is at "H" level. Comparator 91 compares analog signal $V_{inA+}-V_{inA-}$ provided from preceding stage ST1 with reference voltage VD−VC=−(VRT−VRB)/4. If relation of $V_{inA+}-V_{inA-}$>−(VRT−VRB)/4 is satisfied, a signal φ91 is set to "H" level, whereas if relation of $V_{inA+}-V_{inA-}$<−(VRT−VRB)/4 is satisfied, signal φ91 is set to "L" level.

When signals φAt and φ91 are at "L" level and "H" level respectively, logic gate 92 sets a signal φAm to "H" level, and otherwise sets signal φAm to "L" level. Inverter 93 outputs a signal φAb which is an inverted signal of signal φ91. Encoder 94 outputs a digital signal Dout1A of 1.5 bit based on output signals φAt and φ91 of comparators 90 and 91.

Sub ADC 82 includes comparators 95 and 96, a logic gate 97, an inverter 98, and an encoder 99. Comparator 95 is activated during a period in which clock signal φB is at "H" level. Comparator 95 compares analog signal $V_{inB+}-V_{inB-}$ provided from preceding stage ST1 with reference voltage VC−VD=(VRT−VRB)/4. If relation of $V_{inB+}-V_{inB-}$>(VRT−VRB)/4 is satisfied, a signal φBt is set to "H" level, whereas if relation of $V_{inB+}-V_{inB-}$<(VRT−VRB)/4 is satisfied, signal φBt is set to "L" level. Here, analog signal $V_{in+}-V_{inB-}$ is the output signal $V_{out+}-V_{out-}$ of preceding stage ST1 during a period in which clock signal φB is at "H" level.

Comparator 96 is activated during a period in which clock signal φB is at "H" level. Comparator 96 compares analog signal $V_{in+}-V_{inB-}$ provided from preceding stage ST1 with reference voltage VD−VC=−(VRT−VRB)/4. If relation of $V_{inB+}-V_{inB-}$>−(VRT−VRB)/4 is satisfied, a signal φ96 is set to "H" level, whereas if relation of $V_{inB+}-V_{inB-}$<−(VRT−VRB)/4 is satisfied, signal φ96 is set to "L" level.

When signals φBt and φ96 are at "L" level and "H" level respectively, logic gate 97 sets a signal φBm to "H" level, and otherwise sets signal φBm to "L" level. Inverter 98 outputs a signal φBb which is an inverted signal of signal φ96. Encoder 99 outputs a digital signal Dout1B of 1.5 bit based on output signals φBt and φ96 of comparators 95 and 96.

Figure 13:
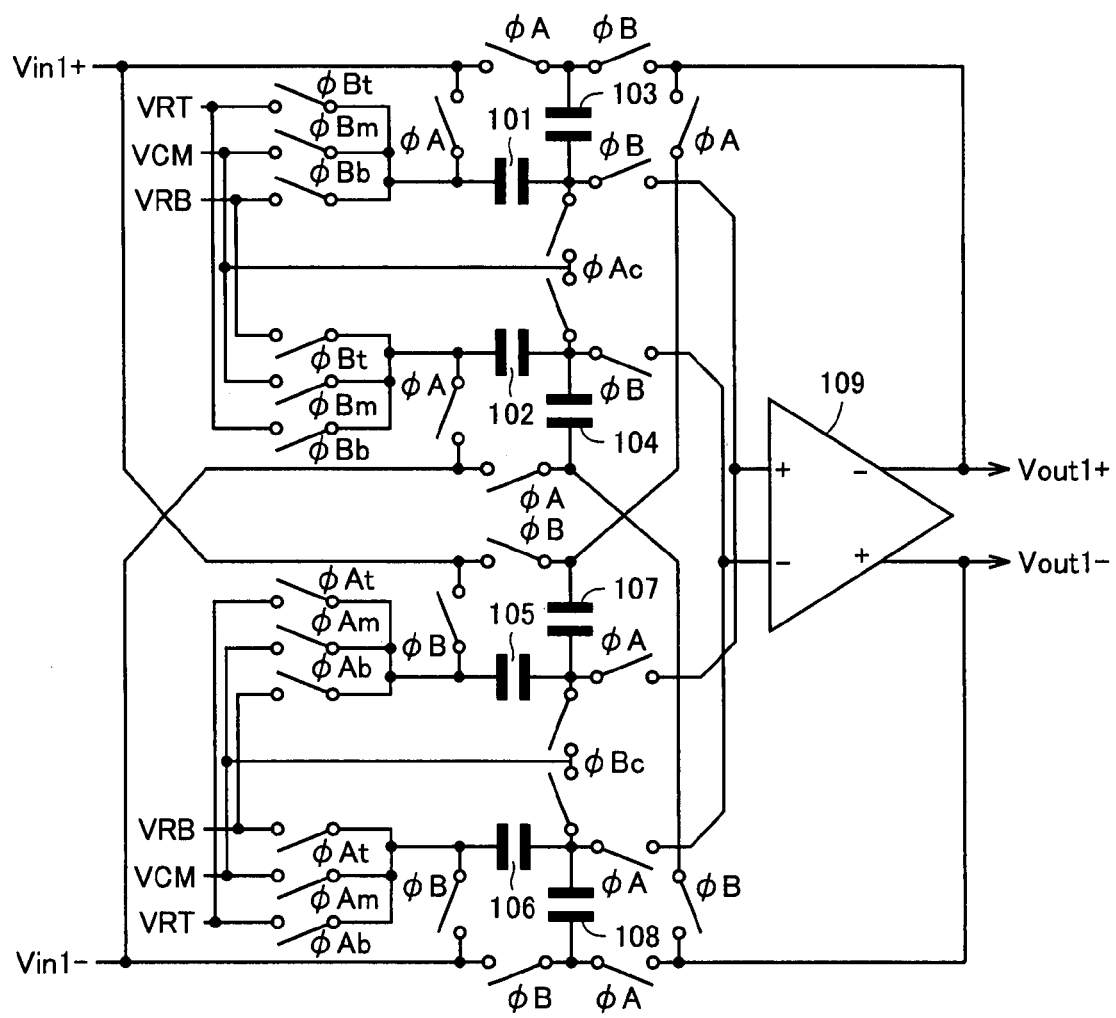
FIG. 13 is a circuit diagram showing a configuration of a sub DAC shown in FIG. 11.
Figure 14:
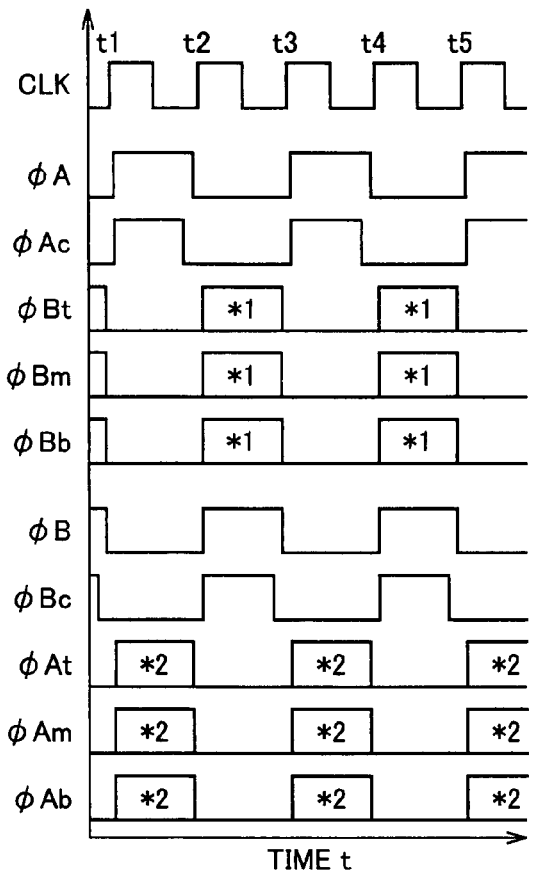
FIG. 14 is a time chart illustrating an operation of the sub DAC shown in FIG. 13.

FIG. 13 is a circuit diagram showing a configuration of sub DAC 85, and FIG. 14 is a time chart illustrating an operation thereof. In FIG. 13, sub DAC 85 includes a plurality of switches of which conduction/non-conduction is controlled by signals φA, φAt, φAm, φAb, φAc, φB, φBt, φBm, φBb, and φBc, eight capacitors 101 to 108, and a differential amplifier 109. Capacitors 101 to 108 have equal capacitance values.

In FIG. 14, a clock signal CLK alternately attains to "H" level and "L" level in prescribed cycles. Clock signal φA is a signal that has a cycle double the cycle of clock signal CLK and rises in response to rising of clock signal CLK. Clock signal φAc is a signal of which falling is slightly earlier than falling of clock signal φA. Clock signal φB is a signal that has a cycle double the cycle of clock signal CLK and falls in response to rising of clock signal CLK. Clock signal φBc is a signal of which falling is slightly earlier than falling of clock signal φB.

When signal CLK is raised to "H" level at time t1, signals φA and φAc are also raised to "H" level, and switches corresponding to signals φA and φAc conduct. Thus, capacitors 101 and 103 are charged with a differential voltage between analog signal $V_{in1+}$ provided from preceding stage ST1 and reference voltage VCM.

Capacitors 102 and 104 are charged with a differential voltage between analog signal $V_{in1-}$ provided from preceding stage ST1 and reference voltage VCM. Meanwhile, one terminals of capacitors 105 and 107 are both connected to an + input terminal of differential amplifier 109, and the other terminal of capacitor 107 is connected to an − output terminal of differential amplifier 109. When any one signal out of output signals φAt, φAm and φAb of sub ADC 81 attains to "H" level and the switches corresponding to the signal conduct (this state is shown with *2 in FIG. 14), the other terminal of capacitor 105 is supplied with voltage VRT, VCM or VRB through the conducting switch.

One terminals of capacitors 106 and 108 are both connected to an − input terminal of differential amplifier 109, and the other terminal of capacitor 108 is connected to an + output terminal of differential amplifier 109. In addition, when any one signal out of output signals φAt, φAm and φAb of sub ADC 81 attains to "H" level and the switches corresponding to the signal conduct (this state is shown with *2 in FIG. 14), the other terminal of capacitor 106 is supplied with voltage VRB, VCM or VRT through the conducting switch. Thus, in synchronization with the rising edge of clock signal CLK, analog signals $V_{out1+}$, $V_{out-}$ at a level in accordance with the output digital signal of sub ADC 81 are output from the − output terminal and the + output terminal of differential amplifier 109. Here, analog signals $V_{in1+}$, $V_{in1-}$ are the output signals $V_{out+}$, $V_{out-}$ of preceding stage ST1.

When signal CLK is raised to "H" level at time t2, signals φB and φBc are also raised to "H" level, and switches corresponding to signals φB and φBc conduct. Thus, capacitors 105 and 107 are charged with the differential voltage between signal $V_{in1+}$ provided from preceding stage ST1 and reference voltage VCM.

Capacitors 106 and 108 are charged with the differential voltage between analog signal $V_{in1-}$ provided from preceding stage ST1 and reference voltage VCM. Meanwhile, one terminals of capacitors 101 and 103 are both connected to the + input terminal of differential amplifier 109, and the other terminal of capacitor 103 is connected to the – output terminal of differential amplifier 109. When any one signal out of output signals φBt, φBm and φBb of sub ADC 82 attains to "H" level and the switches corresponding to the signal conduct (this state is shown with *1 in FIG. 14), the other terminal of capacitor 101 is supplied with voltage VRT, VCM or VRB through the conducting switch.

One terminals of capacitors 102 and 104 are both connected to the – input terminal of differential amplifier 109, and the other terminal of capacitor 104 is connected to the + output terminal of differential amplifier 109. In addition, when any one signal out of output signals φBt, φBm and φBb of sub ADC 82 attains to "H" level and the switches corresponding to the signal conduct (this state is shown with *1 in FIG. 14), the other terminal of capacitor 102 is supplied with voltage VRB, VCM or VRT through the conducting switch. Thus, in synchronization with the rising edge of clock signal CLK, analog signals $V_{out1+}$, $V_{out1-}$ at a level in accordance with the output digital signal of sub ADC 82 are output from the – output terminal and the + output terminal of differential amplifier 109.

Here, $V_{in1+} - V_{in1-}$ is denoted as ΔVin1, $V_{out1+} - V_{out1-}$ is denoted as ΔVy1, and VRT−VRB is denoted as ΔVref. If φBt=H and φBm=φBb=L when φA=L and φB=H, relation of ΔVy1=2ΔVin1−ΔVref is satisfied. In addition, if φBm=H and φBt=φBb=L when φA=L and φB=H, relation of ΔVy1=2ΔVin1 is satisfied. Moreover, if Bb=H and φBt=φBb=L when φA=L and φB=H, relation of ΔVy1=2ΔVin1+ΔVref is satisfied.

Figure 15:
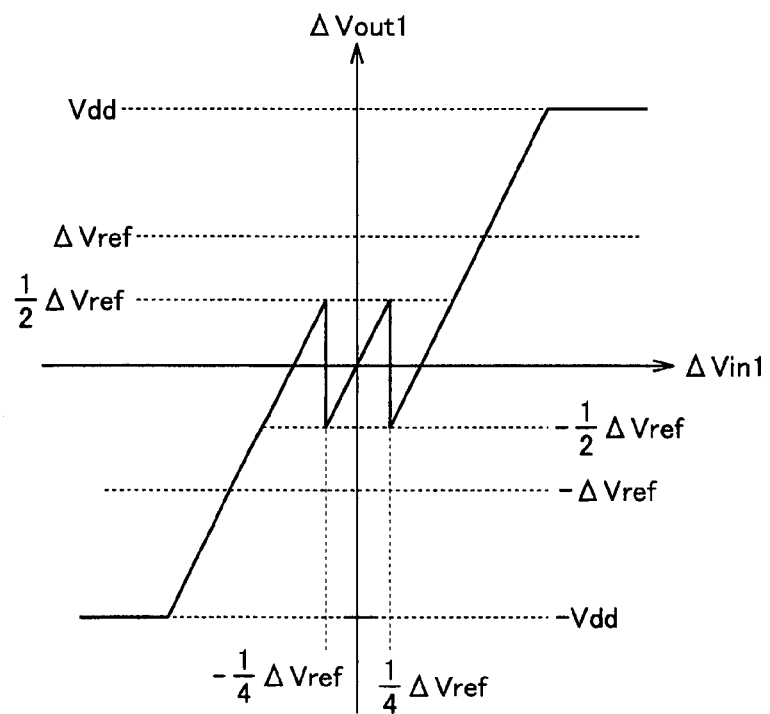
FIG. 15 illustrates a transfer function of stage ST2 shown in FIGS. 11 to 14.

FIG. 15 illustrates a transfer function of stage ST2. In FIG. 15, the abscissa represents ΔVin1=$V_{in1+} - V_{in1-}$ and the ordinate represents ΔVout1=$V_{out1+} - V_{out1-}$. In a section 0<ΔVin1<ΔVref/4, relation of ΔVout1=ΔVin×2 is satisfied. In a section ΔVref/4<ΔVin1, relation of ΔVout1=ΔVin1×2−ΔVref is satisfied. In this section, ΔVout1 increases in proportion to ΔVin1 and reaches power supply voltage Vdd. In a section 0>ΔVin1>−ΔVref/4, relation of ΔVout1=ΔVin×2 is satisfied. In a section −ΔVref/4>ΔVin1, relation of ΔVout1=ΔVin1×2+ΔVref is satisfied. In this section, ΔVout1 decreases with decrease in ΔVin1 and reaches power supply voltage −Vdd.

Thus, when viewed in a direction from 0 to ΔVref, a curve representing the transfer function makes a turn from the positive side toward the negative side when ΔVin1 attains to ΔVref/4. Meanwhile, when viewed in a direction from 0 to −ΔVref, the curve representing the transfer function makes a turn from the negative side toward the positive side when ΔVin1 attains to −ΔVref/4. ΔVref/4 and −ΔVref/4 correspond to comparators 90, 91 or 95, 96. As shown in FIGS. 9 and 10, as ΔVout, i.e., ΔVin1, does not exceed the range from −ΔVref to ΔVref, ΔVout1 does not exceed the range from −ΔVref to ΔVref.

Figure 16:
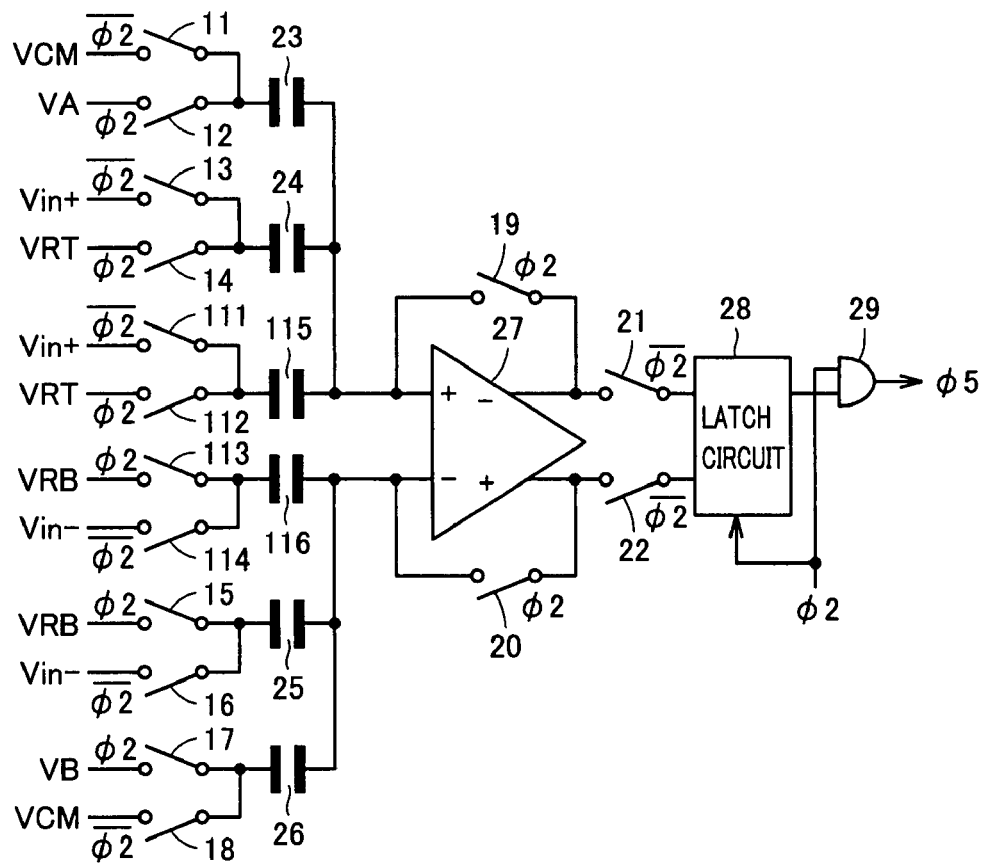
FIG. 16 is a circuit block diagram showing a variation of the first embodiment.

FIG. 16 is a circuit block diagram showing a variation of the first embodiment, to be compared with FIG. 4. In FIG. 16, in this variation, comparator 5 further includes switches 111 to 114 and capacitors 115 and 116. One terminals of switches 111 to 114 receive voltage signals $V_{in+}$, VRT, VRB, and $V_{in-}$, respectively. The other terminals of switches 111 and 112 are both connected to one terminal of capacitor 115. The other terminals of switches 113 and 114 are both connected to one terminal of capacitor 116. The other terminals of capacitors 115 and 116 are connected to the + input terminal and the − input terminal of differential amplifier 27, respectively. Switches 112 and 113 conduct during a period in which clock signal φ2 is at "H" level (clock signal /φ2 is at "L" level). Switches 111 and 114 conduct during a period in which clock signal /φ2 is at "H" level (clock signal φ2 is at "L" level).

Here, assuming that the voltage at the + output terminal and the voltage at the − output terminal of differential amplifier 27 are denoted as Vy1 and Vy2 respectively and an amplification ratio is denoted as A, relation of Vy1−Vy2=A[2($V_{in+}-V_{in-}$)−{2(VRT−VRB)+(VA−VB)}]/3 is satisfied. Therefore, a difference between 2($V_{in+}-V_{in-}$)/3 and 2{(VRT−VRB)+(VA−VB)}/3 is amplified by differential amplifier 27, and attains to "H" level or "L" level.

The result of comparison the same as in FIG. 4 can also be obtained with this configuration. Here, comparator 5 in FIG. 4 compares ($V_{in+}-V_{in-}$)/2 with {(VRT−VRB)+(VA−VB)}/2, whereas comparator 5 in FIG. 16 compares 2($V_{in+}-V_{in-}$)/3 with {2(VRT−VRB)+(VRT−VRB)+(VA−VB)}/3. Namely, comparator 5 in FIG. 4 performs comparison by multiplying ($V_{in+}-V_{in-}$) by ½, whereas comparator 5 in FIG. 16 performs comparison by multiplying ($V_{in+}-V_{in-}$) by ⅔. Therefore, results of comparison more accurate can be obtained with comparator 5 in FIG. 16 than with comparator 5 in FIG. 4.

Comparator 6 may be configured similarly to comparator 5. Here, one terminals of switches 12, 14, 112, 113, 15, and 17 receive reference voltages VB, VRB, VRB, VRT, VRT, and VA, instead of reference voltages VA, VRT, VRT, VRB, VRB, and VB.

Second Embodiment

Figure 17:
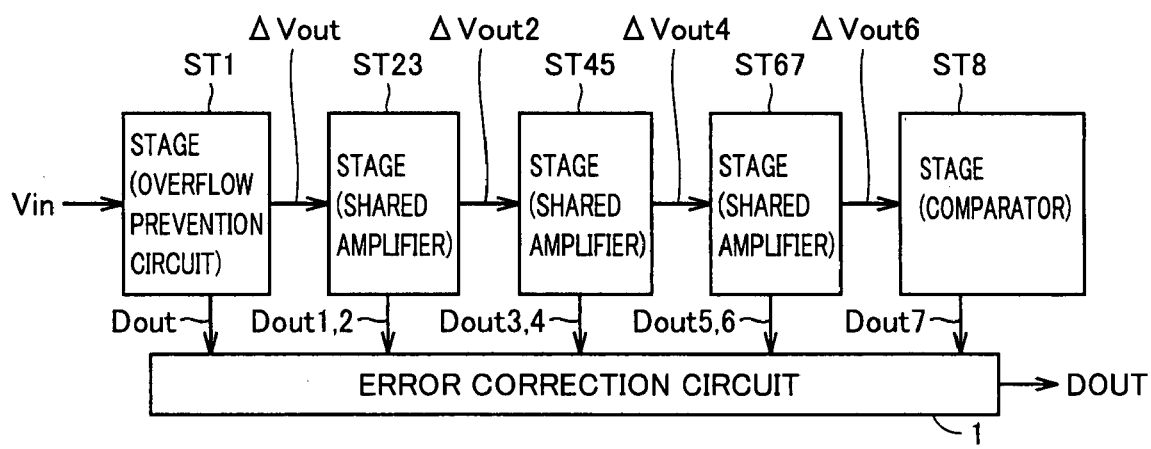
FIG. 17 is a block diagram showing a configuration of a pipeline A/D converter according to a second embodiment of the present invention.

FIG. 17 is a block diagram showing a configuration of a pipeline A/D converter according to a second embodiment of the present invention. In FIG. 17, the pipeline, A/D converter includes five stages ST1, ST23, ST45, ST67, and ST8 that are cascaded, and error correction circuit 1.

First stage ST1 receives analog signal Vin to be A/D converted. Stage ST1 generates digital signal Dout of 3.25 bits based on input analog signal Vin, and provides generated digital signal Dout to error correction circuit 1. In addition, stage ST1 generates analog signal ΔVout at a level in accordance with input analog signal Vin and generated digital signal Dout, and provides generated analog signal ΔVout to next stage ST23. Moreover, stage ST1 includes an overflow prevention circuit maintaining the level of analog signal ΔVout within a normal output voltage range even if the level of input analog signal Vin exceeds a prescribed input voltage range. Stage ST1 has the configuration same as in the first embodiment.

Second stage ST23 generates digital signal Dout1 of 1.5 bit based on analog signal ΔVout from preceding stage ST1 and provides generated digital signal Dout1 to error correction circuit 1. In addition, stage ST23 generates analog signal ΔVout1 at a level in accordance with input analog signal ΔVout and generated digital signal Dout1, generates a digital signal Dout2 of 1.5 bit based on generated analog signal ΔVout1, and provides generated digital signal Dout2 to error correction circuit 1. Moreover, stage ST23 generates an analog signal ΔVout2 based on generated analog signal ΔVout1 and generated digital signal Dout2, and provides generated analog signal ΔVout2 to next stage ST45. Stage ST23 adopts what is called a vertical shared amplifier configuration, and attains a function of stages ST2 and ST3 in FIG. 1. Each of stages ST45 and ST67 is configured similarly to stage ST23.

Last stage ST8 includes a comparator, generates digital signal Dout7 of 2 bits based on analog signal ΔVout6 from preceding stage ST67, and provides generated digital signal Dout7 to error correction circuit 1. Error correction circuit 1 outputs last digital signal DOUT based on digital signals Dout to Dout7 output from stages ST1, ST23, ST45, ST67, and ST8.

Figure 18:
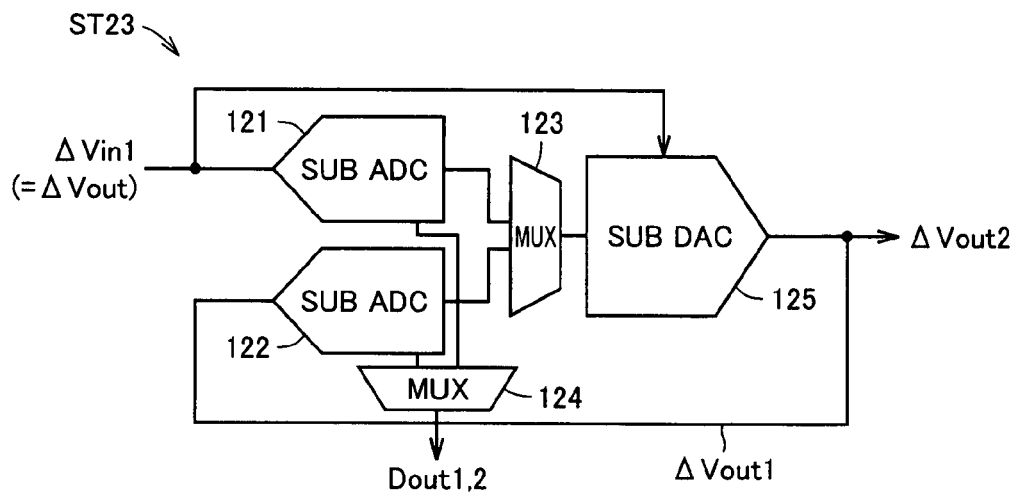
FIG. 18 is a block diagram showing a configuration of a stage ST23 shown in FIG. 17.

FIG. 18 is a block diagram showing a configuration of stage ST23. In FIG. 18, stage ST23 includes sub ADCs 121 and 122, multiplexers 123 and 124, and a sub DAC 125. Sub ADCs 121 and 122 are alternately activated for a prescribed period. Sub ADC 121 converts analog signal ΔVin=ΔVout provided from preceding stage ST1 to digital signal Dout1 of 1.5 bit and outputs a switch signal at a level in accordance with analog signal Vin.

Sub ADC 122 converts analog signal ΔVout1 provided from sub DAC 125 to digital signal Dout2 of 1.5 bit and outputs a switch signal at a level in accordance with analog signal ΔVout1. Multiplexer 123 alternately provides the switch signals generated in sub ADCs 121 and 122 to sub DAC 125. Multiplexer 124 alternately provides digital signals Dout1 and Dout2 generated in sub ADCs 121 and 122 to error correction circuit 1. Sub DAC 125 outputs analog signals Vout1 and Vout2 at a level in accordance with analog signals ΔVin1 and ΔVout1 and the switch signals provided from sub ADCs 121 and 122.

Figure 19:
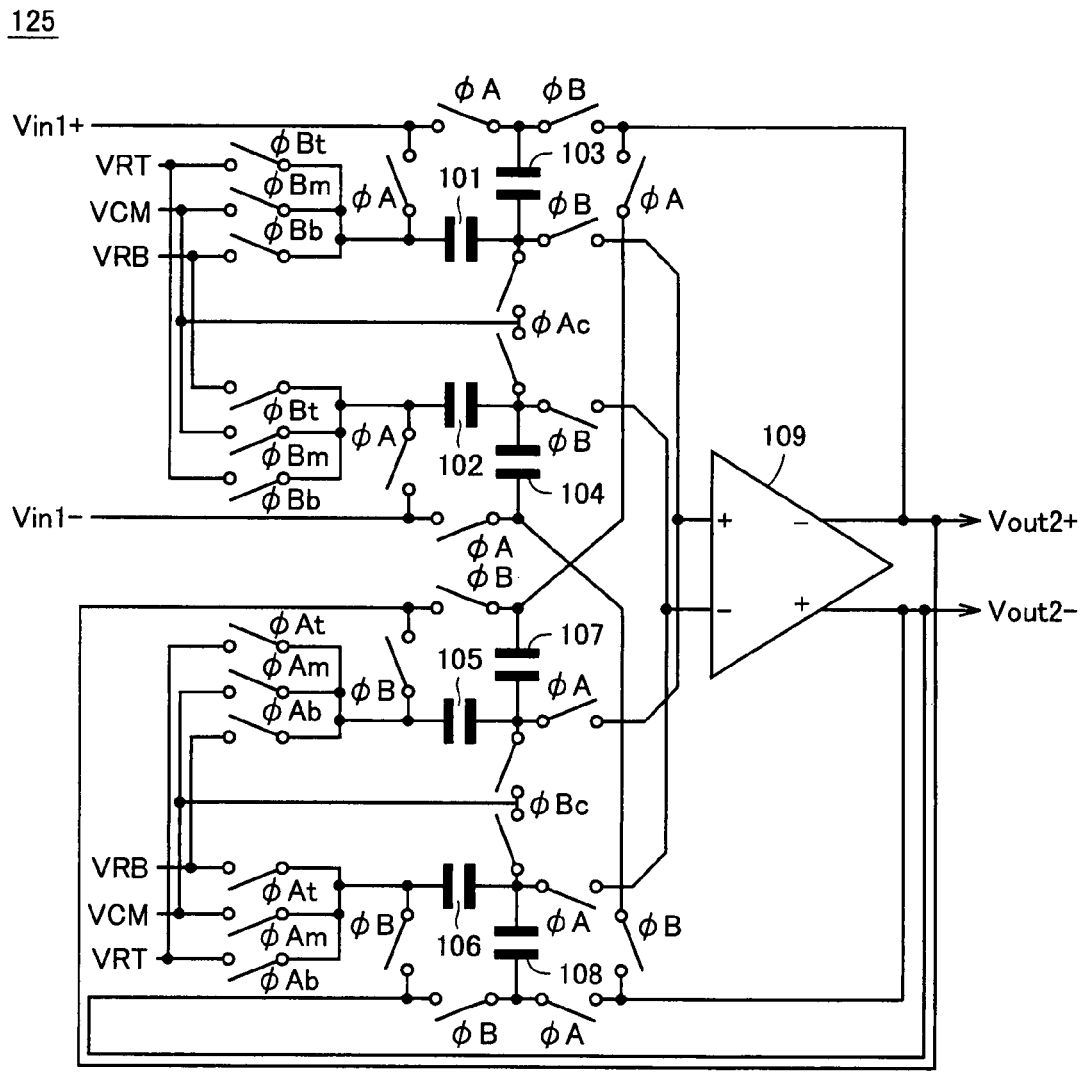
FIG. 19 is a circuit diagram showing a configuration of a sub DAC shown in FIG. 18.
Figure 20:
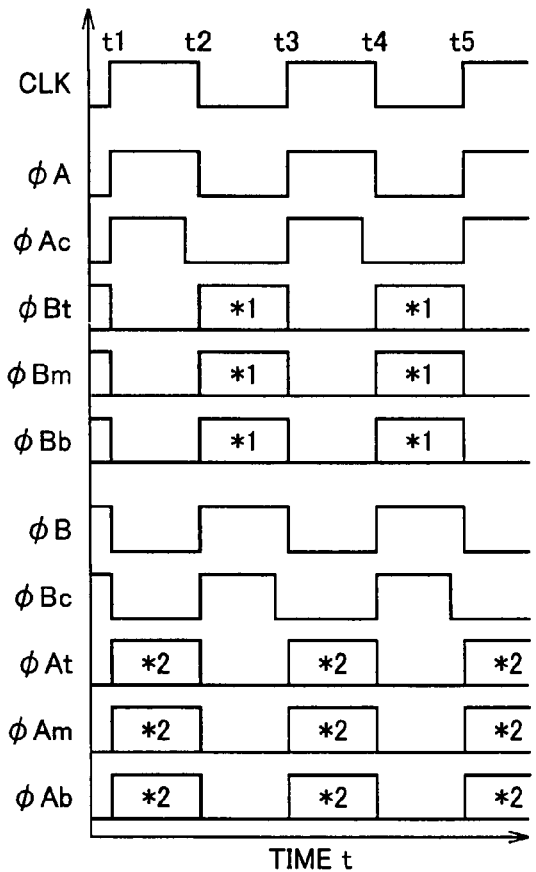
FIG. 20 is a time chart illustrating an operation of the sub DAC shown in FIG. 19.

FIG. 19 is a circuit diagram showing a configuration of sub DAC 125, and FIG. 20 is a time chart illustrating an operation thereof. In FIG. 19, sub DAC 125 includes a plurality of switches of which conduction/non-conduction is controlled by signals φA, φAt, φAm, φAb, φAc, φB, φBt, φBm, φBb, and φBc, eight capacitors 101 to 108, and differential amplifier 109. Capacitors 101 to 108 have equal capacitance values.

In FIG. 20, clock signal CLK alternately attains to "H" level and "L" level in prescribed cycles. Clock signal φA is a signal that has a cycle the same as that of clock signal CLK and rises in response to rising of clock signal CLK. Clock signal φAc is a signal of which falling is slightly earlier than falling of clock signal φA. Clock signal φB is a signal that has a cycle the same as that of clock signal CLK and falls in response to rising of clock signal CLK. Clock signal φBc is a signal of which falling is slightly earlier than falling of clock signal φB.

When signal CLK is raised to "H" level at time t1, signals φA and φAc are also raised to "H" level, and switches corresponding to signals φA and φAc conduct. Thus, capacitors 101 and 103 are charged with the differential voltage between analog signal $V_{in1+}$ provided from preceding stage ST1 and reference voltage VCM.

Capacitors 102 and 104 are charged with the differential voltage between analog signal $V_{in1-}$ provided from preceding stage ST1 and reference voltage VCM. Meanwhile, one terminals of capacitors 105 and 107 are both connected to the + input terminal of differential amplifier 109, and the other terminal of capacitor 107 is connected to the – output terminal of differential amplifier 109. When any one signal out of output signals φAt, φAm and φAb of sub ADC 121 attains to "H" level and the switches corresponding to the signal conduct (this state is shown with *2 in FIG. 20), the other terminal of capacitor 105 is supplied with voltage VRT, VCM or VRB through the conducting switch.

One terminals of capacitors 106 and 108 are both connected to the – input terminal of differential amplifier 109, and the other terminal of capacitor 108 is connected to the + output terminal of differential amplifier 109. In addition, when any one signal out of output signals φAt, φAm and φAb of sub ADC 121 attains to "H" level and the switches corresponding to the signal conduct (this state is shown with *2 in FIG. 20), the other terminal of capacitor 106 is supplied with voltage VRB, VCM or VRT through the conducting switch. Thus, in synchronization with clock signal CLK, analog signals $V_{out1+}$, $V_{out1-}$ at a level in accordance with the output digital signal of sub ADC 121 are output from the – output terminal and the + output terminal of differential amplifier 109. Here, analog signals $V_{in1+}$, $V_{in1-}$ are the output signals $V_{out+}$, $V_{out-}$ of preceding stage ST1.

When signal CLK falls to "L" level at time t2, signals φB and φBc are raised to "H" level, and switches corresponding to signals φB and φBc conduct. Thus, capacitors 105 and 107 are charged with a voltage which is the difference from reference voltage VCM.

Capacitors 106 and 108 are charged with a differential voltage between analog signal $V_{out1-}$ provided from differential amplifier 109 and reference voltage VCM. Meanwhile, one terminals of capacitors 101 and 103 are both connected to the + input terminal of differential amplifier 109, and the other terminal of capacitor 103 is connected to the – output terminal of differential amplifier 109. When any one signal out of output signals φBt, φBm and φBb of sub ADC 122 attains to "H" level and the switches corresponding to the signal conduct (this state is shown with *1 in FIG. 20), the other terminal of capacitor 101 is supplied with voltage VRT, VCM or VRB through the conducting switch.

One terminals of capacitors 102 and 104 are both connected to the – input terminal of differential amplifier 109, and the other terminal of capacitor 104 is connected to the + output terminal of differential amplifier 109. In addition, when any one signal out of output signals φBt, φBm and φBb of sub ADC 122 attains to "H" level and the switches corresponding to the signal conduct (this state is shown with *1 in FIG. 20), the other terminal of capacitor 102 is supplied with voltage VRB, VCM or VRT through the conducting switch. Thus, in synchronization with clock signal CLK, analog signals $V_{out2+}$, $V_{out2-}$ at a level in accordance with the output digital signal of sub ADC 122 are output from the – output terminal and the + output terminal of differential amplifier 109. As the configuration and the operation are otherwise the same as in the first embodiment, description thereof will not be repeated.

The second embodiment can also attain the effect the same as in the first embodiment.

Third Embodiment

Figure 21:
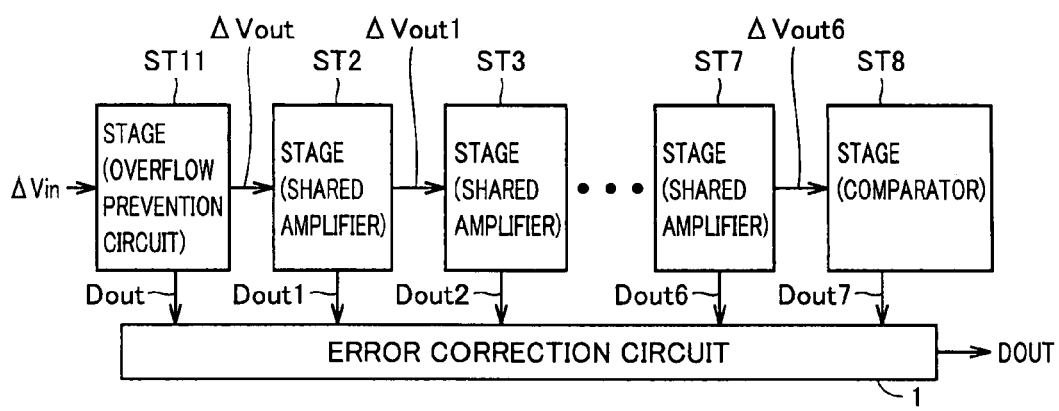
FIG. 21 is a block diagram showing a configuration of a pipeline A/D converter according to a third embodiment of the present invention.

FIG. 21 is a block diagram showing a configuration of a pipeline A/D converter according to a third embodiment of the present invention. In FIG. 21, the pipeline A/D converter is different from the pipeline A/D converter in FIG. 1 in that first stage ST1 adapted to 3.25 bits is replaced with a first stage ST11 adapted to 2.5 bits.

First stage ST11 receives analog signal ΔVin to be A/D converted. Stage ST11 generates digital signal Dout of 2.5 bits (any one of 000 to 100) based on input analog signal ΔVin, and provides generated digital signal Dout to error correction circuit 1. In addition, stage ST11 generates analog signal ΔVout at a level in accordance with input analog signal ΔVin and generated digital signal Dout, and provides generated analog signal ΔVout to next stage ST2. Moreover, stage ST11 includes an overflow prevention circuit maintaining analog signal ΔVout within a normal voltage output range even if the level of input analog signal Vin exceeds a prescribed input voltage range.

Second stage ST2 generates digital signal Dout1 of 1.5 bit based on analog signal ΔVout from preceding stage ST11 and provides generated digital signal Dout1 to error correction circuit 1. In addition, stage ST2 generates analog signal ΔVout1 at a level in accordance with input analog signal ΔVout and generated digital signal Dout1, and provides generated analog signal ΔVout1 to next stage ST3. Stage ST2 adopts what is called a lateral shared amplifier configuration. Each of third to seventh stages ST3 to ST7 is configured similarly to stage ST2.

Last stage ST8 includes a comparator, generates digital signal Dout7 of 2 bits based on analog signal ΔVout6 from preceding stage ST7, and provides generated digital signal Dout7 to error correction circuit 1. Error correction circuit 1 outputs last digital signal DOUT based on digital signals Dout to Dout7 output from stages ST1 to ST8.

Figure 22:
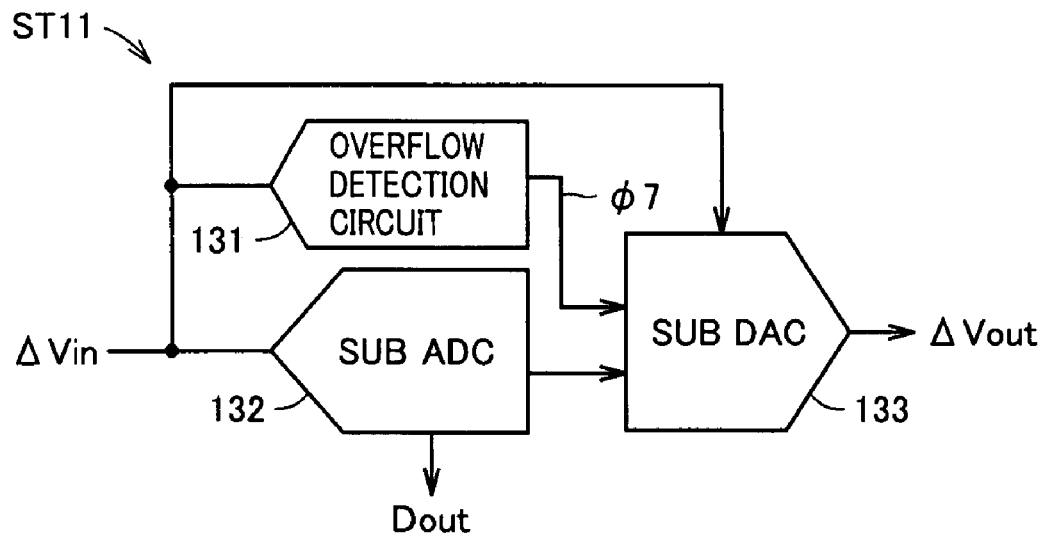
FIG. 22 is a block diagram showing a configuration of a stage ST11 shown in FIG. 21.

FIG. 22 is a block diagram showing a configuration of first stage ST11. In FIG. 22, stage ST11 includes an overflow detection circuit 131, a sub ADC 132, and a sub DAC 133. When the level of input analog signal ΔVin exceeds a prescribed range, overflow detection circuit 131 sets signal φ7 to "H" level representing an activation level. Sub ADC 132 converts input analog signal ΔVin to digital signal Dout of 2.5 bits and provides the digital signal to error correction circuit 1, as well as provides a switch signal in accordance with digital signal Dout to sub DAC 133. Sub DAC 133 generates analog signal ΔVout based on input analog signal ΔVin and the switch signal from sub ADC 132, and provides generated analog signal ΔVout to next stage ST2. In addition, when signal φ7 is set to "H" level, sub DAC 133 sets analog signal ΔVout to 0 level.

Figure 23:
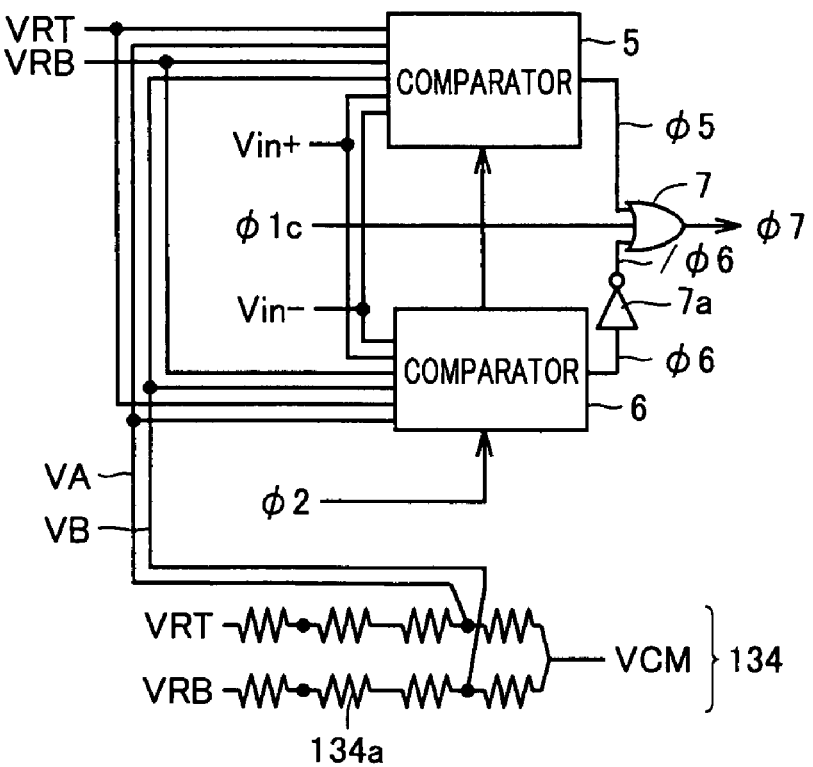
FIG. 23 is a circuit block diagram showing a configuration of an overflow detection circuit shown in FIG. 22.

FIG. 23 is a circuit block diagram showing a configuration of overflow detection circuit 131. In FIG. 23, overflow detection circuit 131 includes comparators 5 and 6, OR gate 7, inverter 7a, and a reference voltage generation circuit 134. Reference voltage generation circuit 134 includes eight resistance elements 134a connected in series. As these resistance elements 134a have equal resistance values, reference voltage VRT−VRB is divided to generate reference voltages VA=(VRT−VRB)×5/8, VB=(VRT−VRB)×3/8, and VCM=(VRT−VRB)/2.

Comparator 5 compares input analog signal $V_{in+}-V_{in-}$ with reference voltage VRT−VRB+VA−VB=(VRT−VRB)×5/4, which represents the upper limit. If relation of $V_{in+}-V_{in-}$>(VRT−VRB)×5/4 is satisfied, signal φ5 is set to "H" level, whereas if relation of $V_{in+}-V_{in-}$<(VRT−VRB)×5/4 is satisfied, signal φ5 is set to "L" level.

Comparator 6 compares input analog signal $V_{in+}-V_{in-}$ with reference voltage VRB−VRT+VB−VA=(VRB−VRT)×5/4, which represents the lower limit. If relation of $V_{in+}-V_{in-}$<(VRB−VRT)×5/4 is satisfied, signal φ6 is set to "H" level, whereas if relation of $V_{in+}-V_{in-}$>(VRB−VRT)×5/4 is satisfied, signal φ6 is set to "L" level.

Inverter 7a receives output signal φ6 from comparator 6, and outputs inverted signal /φ6 thereof. OR gate 7 receives output signal φ5 of comparator 5, output signal /φ6 of inverter 7a and clock signal φ1c, and outputs signal φ7. When at least one of signals φ5, /φ6, and φ1c attains to "H" level, signal φ7 is set to "H" level.

Figure 24:
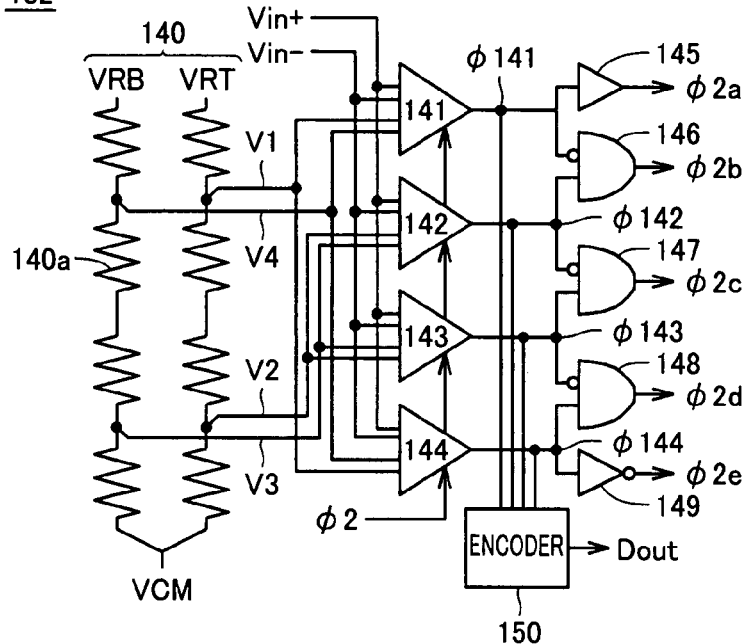
FIG. 24 is a circuit block diagram showing a configuration of a sub ADC shown in FIG. 22.

FIG. 24 is a circuit block diagram showing a configuration of sub ADC 132. In FIG. 24, sub ADC 132 includes a reference voltage generation circuit 140, comparators 141 to 144, a buffer 145, logic gates 146 to 148, an inverter 149, and an encoder 150. Reference voltage generation circuit 140 includes eight resistance elements 140a connected in series. Reference voltage generation circuit 140 divides reference voltage VRT−VRB=ΔVref to generate reference voltages V1 to V4. Eight resistance elements 140a have equal resistance values.

Comparators 141 to 144 are activated while clock signal φ2 is at "H" level. Comparator 141 compares input analog signal $V_{in+}-V_{in-}$ with reference voltage V1−V4=ΔVref×3/4. If relation of $V_{in+}-V_{in-}$>ΔVref×3/4 is satisfied, a signal φ141 is set to "H" level, whereas if relation of $V_{in+}-V_{in-}$<ΔVref×3/4 is satisfied, signal φ141 is set to "L" level. Comparator 142 compares input analog signal $V_{in+}-V_{in-}$ with reference voltage V2−V3=ΔVref/4. If relation of $V_{in+}-V_{in-}$>ΔVref/4 is satisfied, a signal φ142 is set to "H" level, whereas if relation of $V_{in+}-V_{in-}$<ΔVref/4 is satisfied, signal φ142 is set to "L" level.

Comparator 143 compares input analog signal $V_{in+}-V_{in-}$ with reference voltage V3−V2=−ΔVref/4. If relation of $V_{in+}-V_{in-}$>−ΔVref/4 is satisfied, a signal φ143 is set to "H" level, whereas if relation of $V_{in+}-V_{in-}$<−ΔVref/4 is satisfied, signal φ143 is set to "L" level. Comparator 144 compares input analog signal $V_{in+}-V_{in-}$ with reference voltage V4−V1=−ΔVref×3/4. If relation of $V_{in+}-V_{in-}$>−ΔVref×3/4 is satisfied, a signal φ144 is set to "H" level, whereas if relation of $V_{in+}-V_{in-}$<−ΔVref×3/4 is satisfied, signal φ144 is set to "L" level. When clock signal φ2 is at "L" level, output signals φ141 to φ144 of comparators 141 to 144 are fixed to "L" level.

Buffer 145 delays signal φ141 and outputs the resultant signal as signal φ2a. When signal φ141 attains to "L" level and signal φ142 attains to "H" level, logic gate 146 sets signal φ2b to "H" level. When signal φ142 attains to "L" level and signal φ143 attains to "H" level, logic gate 147 sets signal φ2c to "H" level. When signal φ143 attains to "L" level and signal φ144 attains to "H" level, logic gate 148 sets signal φ2d to "H" level. Inverter 149 inverts signal φ144 and outputs the inverted signal as signal φ2e. Encoder 150 generates digital signal Dout of 2.5 bits based on output signals φ141 to φ144 of comparators 141 to 144, and outputs generated digital signal Dout to error correction circuit 1.

Figure 25:
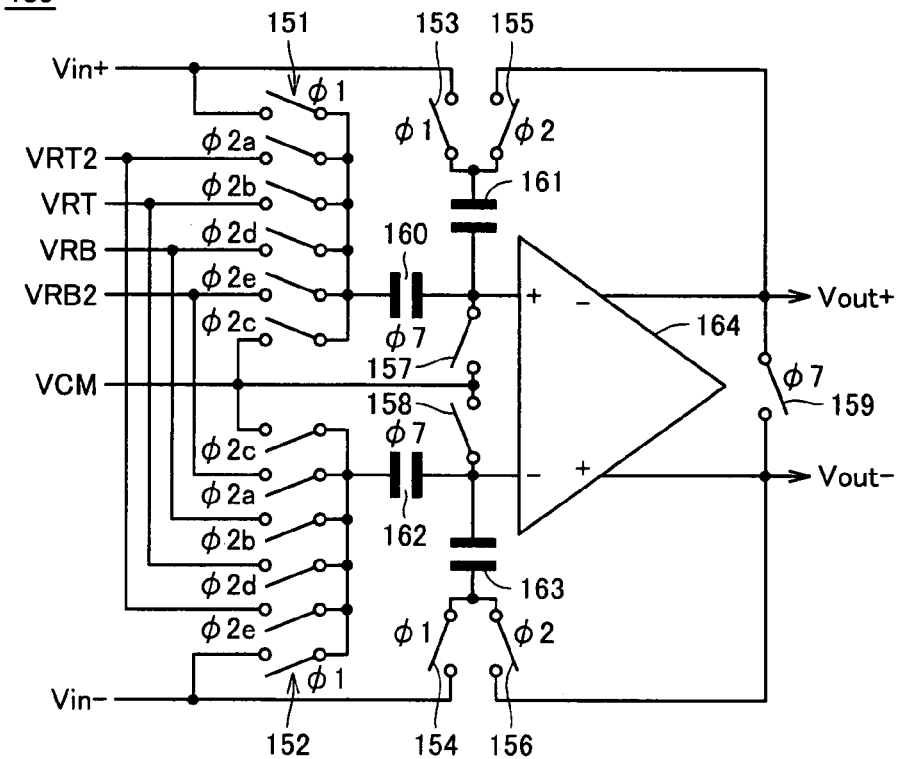
FIG. 25 is a circuit diagram showing a configuration of a sub DAC shown in FIG. 22.

FIG. 25 is a circuit diagram showing a configuration of sub DAC 133. In FIG. 25, sub DAC 133 includes switches 151 to 159, four capacitors 160 to 163, and a differential amplifier 164. Capacitors 160 to 163 have equal capacitance values.

Switch 151 has six switch terminals and one common terminal, and it is controlled by signals φ1 and φ2a to φ2e. Six switch terminals of switch 151 receive voltage signals $V_{in+}$, VRT2, VRT, VCM, VRB, and VRB2 respectively, the common terminal thereof is connected to one terminal of capacitor 160, and the other terminal of capacitor 160 is connected to a + input terminal of differential amplifier 164. Here, relation of VRT2=VCM+VRT−VRB and VRB2=VCM+VRB−VRT is satisfied. Therefore, relation of VRT2−VRB2=2(VRT−VRB)=2ΔVref is satisfied. When signals φ1 and φ2a to φ2e are set to "H" level, voltage signals $V_{in+}$, VRT2, VRT, VCM, VRB, and VRB2 are provided to one terminal of capacitor 160 through the common terminal.

Switch 152 has six switch terminals and one common terminal, and it is controlled by signals φ1 and φ2a to φ2e. Six switch terminals of switch 152 receive voltage signals $V_{in-}$, VRT2, VRT, VCM, VRB, and VRB2 respectively, the common terminal thereof is connected to one terminal of capacitor 162, and the other terminal of capacitor 162 is connected to a − input terminal of differential amplifier 164. When signals φ1 and φ2a to φ2e are set to "H" level, voltage signals $V_{in-}$, VRB2, VRB, VCM, VRT, and VRT2 are provided to one terminal of capacitor 162 through the common terminal.

One terminal of switch 153 receives analog signal $V_{in+}$, and switch 153 has the other terminal connected to one terminal of capacitor 161. Capacitor 161 has the other terminal connected to the + input terminal of differential amplifier 164. Switch 155 is connected between one terminal of capacitor 161 and an − output terminal of differential amplifier 164. One terminal of switch 154 receives analog signal $V_{in-}$, and switch 154 has the other terminal connected to one terminal of capacitor 163. Capacitor 163 has the other terminal connected to the − input terminal of differential amplifier 164. Switch 156 is connected between one terminal of capacitor 163 and an + output terminal of differential amplifier 164. One terminals of switches 157 and 158 both receive reference voltage VCM, and switches 157 and 158 have the other terminals connected to the + input terminal and the − input terminal of differential amplifier 164 respectively. Switch 159 is connected between the + output terminal and the − output terminal of differential amplifier 164. Switches 153 and 154 conduct during a period in which clock signal φ1 is at "H" level, switches 155 and 156 conduct during a period in which clock signal φ2 is at "H" level, and switches 157 to 159 conduct during a period in which clock signal φ7 is at "H" level. Analog voltage signals $V_{out+}$, $V_{out-}$ are output from the − output terminal and the + output terminal of differential amplifier 164 respectively.

Here, $V_{in+}-V_{in-}$ is denoted as ΔVin, $V_{out+}-V_{out-}$ is denoted as ΔVy, and VRT−VRB is denoted as ΔVref. If only φ2a out of φ2a to φ2e is at "H" level, relation of ΔVy=2ΔVin−2ΔVref is satisfied. Meanwhile, if only φ2b out of φ2a to φ2e is at "H" level, relation of ΔVy=2ΔVin−ΔVref is satisfied. In addition, if only φ2c out of φ2a to φ2e is at "H" level, relation of ΔVy=2ΔVin is satisfied. Moreover, if only φ2d out of φ2a to φ2e is at "H" level, relation of ΔVy=2ΔVin+ΔVref is satisfied. Further, if only φ2e out of φ2a to φ2e is at "H" level, relation of ΔVy=2ΔVin+2ΔVref is satisfied.

Figure 26:
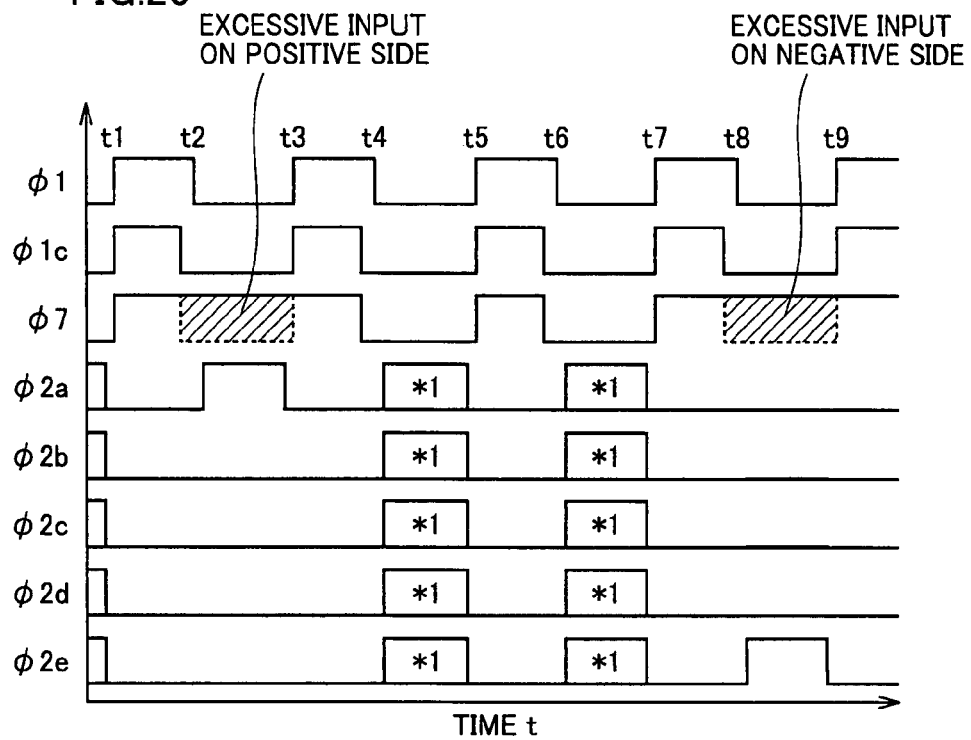
FIG. 26 is a time chart illustrating an operation of the sub DAC shown in FIG. 25.

FIG. 26 is a time chart illustrating an operation of sub DAC 133. In FIG. 26, clock signal φ1 is set to "H" level from time t1 to t2, from t3 to t4, from t5 to t6, from t7 to t8, and so on, and set to "L" level from time t2 to t3, from t4 to t5, from t6 to t7, from t8 to t9, and so on. Clock signal φ1c is a signal of which falling is earlier by a prescribed period than falling of clock signal φ1. Signal φ7 is an output signal of overflow detection circuit 131. Signals φ2a to φ2e are output signals of sub ADC 132.

When signal φ1 is raised to "H" level at time t1, signals φ1c and φ7 are also raised to "H" level. Thus, capacitors 160 and 161 are charged with the differential voltage between signal $V_{in+}$ and reference voltage VCM, and capacitors 162 and 163 are charged with the differential voltage between signal $V_{in-}$ and reference voltage VCM. Then, when signal φ1 falls to "L" level at time t2, switches 153 and 154 become non-conducting. In addition, signal φ2 is raised to "H" level, and switches 155 and 156 conduct.

Here, it is assumed that input signal $V_{in+}-V_{in-}$ overflows to the positive side. Then, even when signal φ1c attains to "L" level, signal φ7 is maintained at "H" level, signal φ2a attains to "H" level, and signals /φ2b to /φ2e attain to "L" level. Thus, though reference voltages VRT2 and VRB2 are applied to one terminals of capacitors 160 and 162, switches 157 to 159 conduct. Therefore, output voltage $V_{out+}-V_{out-}$ of differential amplifier 157 is set to 0V.

When signal φ1 is raised to "H" level at time t3, signal φ1c is also raised to "H" level. Thus, capacitors 160 and 161 are charged with the differential voltage between signal $V_{in+}$ and reference voltage VCM, and capacitors 162 and 163 are charged with the differential voltage between signal $V_{in-}$ and reference voltage VCM. Then, when signal φ1 falls to "L" level at time t4, switches 153 and 154 become non-conducting. In addition, signal φ2 is raised to "H" level, and switches 155 and 156 conduct.

Here, it is assumed that overflow of input signal $V_{in+}-V_{in-}$ does not occur. Then, when signal φ1c attains to "L" level, signal φ7 falls to "L" level, any one of signals φ2b to φ2e attains to "H" level in accordance with the level of input signal $V_{in+}-V_{in-}$, and remaining signals attain to "L" level (this state is shown with *1 in FIG. 26). Thus, switches 157 to 159 become non-conducting, and a voltage corresponding to the signal at "H" level out of signals φ2b to φ2d is applied to one terminals of capacitors 160 and 162. Thus, voltage $V_{out+}-V_{out-}$ at a level in accordance with the level of input signal $V_{in+}-V_{in-}$ is output.

When signal φ1 is raised to "H" level at time t7, signals φ1c and φ7 are also raised to "H" level. Thus, capacitors 160 and 161 are charged with the differential voltage between signal $V_{in+}$ and reference voltage VCM, and capacitors 162 and 163 are charged with the differential voltage between signal $V_{in-}$ and reference voltage VCM. Then, when signal φ1 falls to "L" level at time t8, switches 153 and 154 become non-conducting. In addition, signal φ2 is raised to "H" level, and switches 155 and 156 conduct.

Here, it is assumed that input signal $V_{in+}-V_{in-}$ overflows to the negative side. Then, even when signal φ1c attains to "L" level, signal φ7 is maintained at "H" level, signal φ2e attains to "H" level, and signals φ2a to φ2d attain to "L" level. Thus, though reference voltages VRB2 and VRT2 are applied to one terminals of capacitors 160 and 162, switches 157 to 159 conduct. Therefore, output voltage $V_{out+}-V_{out-}$ of differential amplifier 157 is set to 0V.

Figure 27:
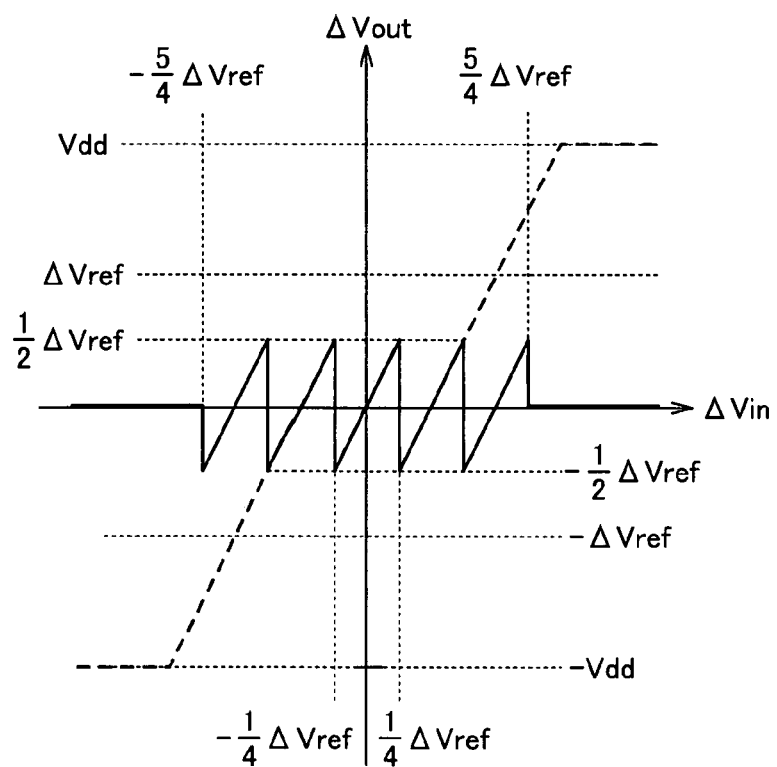
FIG. 27 illustrates a transfer function of stage ST11 shown in FIGS. 22 to 26.

FIG. 27 illustrates a transfer function of stage ST11. In FIG. 27, the abscissa represents $ΔVin=V_{in+}-V_{in-}$ and the ordinate represents $ΔVout=V_{out+}-V_{out-}$. In a section 0<ΔVin<ΔVref/4, relation of ΔVout=ΔVin×2 is satisfied. In a section ΔVref/4<ΔVin<ΔVref×3/4, relation of ΔVout=ΔVin×2−ΔVref is satisfied. In a section ΔVref×3/4<ΔVin<ΔVref×5/4, relation of ΔVout=ΔVin×2−ΔVref×2 is satisfied. In a section ΔVref×5/4<ΔVin, relation of ΔVout=0 is satisfied.

Thus, a curve representing the transfer function makes a turn from the positive side toward the negative side when ΔVin attains to ΔVref/4, ΔVref×3/4, and ΔVref×5/4. ΔVref/4 and ΔVref×3/4 correspond to comparators 142 and 141 respectively, and ΔVref×5/4 corresponds to comparator 5.

In a section 0>ΔVin>−ΔVref/4, relation of ΔVout=ΔVin×2 is satisfied. In a section −ΔVref/4>ΔVin>−ΔVref×3/4, relation of ΔVout=ΔVin×2+ΔVref is satisfied. In a section −ΔVref×3/4>ΔVin>−ΔVref×5/4, relation of ΔVout=ΔVin×2+ΔVref×2 is satisfied. In a section −ΔVref×5/4>ΔVin, relation of ΔVout=0 is satisfied.

Thus, when viewed in a direction from 0 to −ΔVref, a curve representing the transfer function makes a turn from the negative side toward the positive side when ΔVin attains to −ΔVref/4, −ΔVref×3/4, and −ΔVref×5/4−ΔVref/4 and −ΔVref×3/4 correspond to comparators 143 and 144 respectively, and −ΔVref×5/4 corresponds to comparator 6.

A dotted line in FIG. 27 represents the transfer function of the first stage in the conventional pipeline A/D converter. In the conventional first stage, the digital signal of 1.5 bit has been generated using −ΔVref/4 and ΔVref/4 as reference voltages. The transfer function of the conventional first stage is the same as the transfer function of stage ST11 according to the second embodiment in the section 0<ΔVin<ΔVref×3/4, however, if ΔVin is higher than ΔVref×3/4, ΔVout increases in proportion to ΔVin and reaches power supply voltage Vdd. Meanwhile, the transfer function of the conventional first stage is the same as the transfer function of stage ST11 according to the second embodiment in the section 0>ΔVin>−ΔVref×3/4, however, if ΔVin is lower than −ΔVref×3/4, ΔVout decreases in proportion to ΔVin and reaches power supply voltage −Vdd. In other words, with the conventional first stage, if ΔVin is higher than ΔVref×3/4 or lower than −ΔVref×3/4, ΔVout exceeds the normal output voltage range.

In contrast, with stage ST11 according to the third embodiment, two more turning points of the transfer function are provided on each of the positive side and the negative side. In addition, if ΔVin is higher than ΔVref×5/4 or lower than −ΔVref×5/4, output voltage ΔVout is set to 0V. Therefore, ΔVout is always accommodated in the normal output voltage range.

Figure 28:
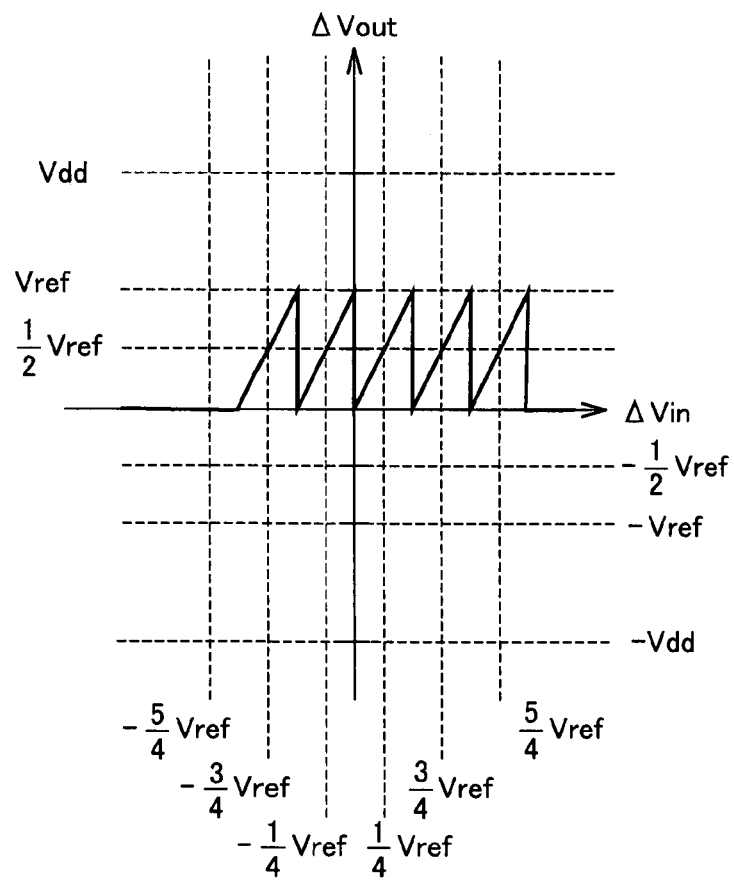
FIG. 28 illustrates an effect of stage ST11 shown in FIGS. 22 to 26.

FIG. 28 shows a transfer function when factors such as variation in manufacturing have led to comparison by comparators 5, 6, and 141 to 144 with error of +ΔVref/4. Even in such a case, ΔVout is accommodated in the normal output voltage range, namely from −ΔVref to ΔVref. Therefore, malfunction originating from overflow does not occur.

Figure 29:
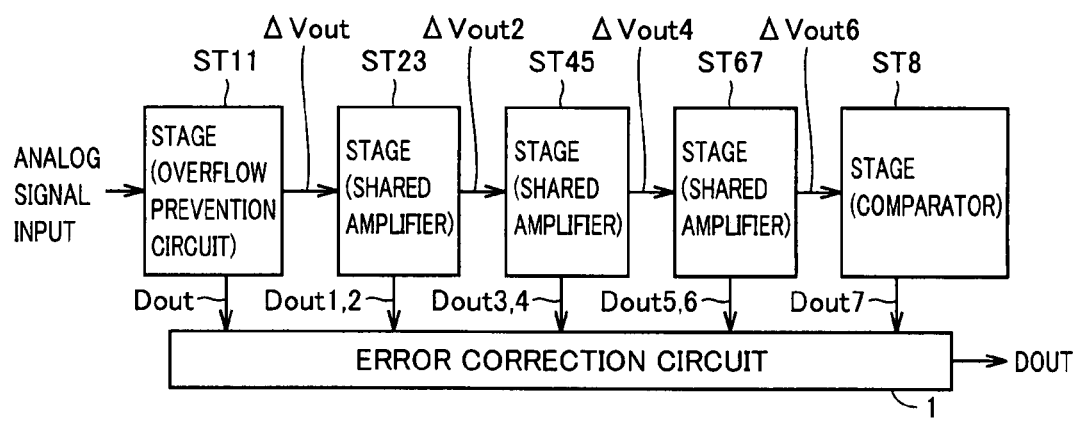
FIG. 29 is a circuit block diagram showing a variation of the third embodiment.

Here, as shown in FIG. 29, stages ST2 to ST7 may naturally be replaced with stages ST23, ST45 and ST67 adopting the lateral shared amplifier configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pipeline A/D converter converting an analog signal to a digital signal, comprising:
   first to Nth stages that are cascaded, where N is an integer not smaller than 2; and
   an error correction circuit generating said digital signal based on sub digital signals output from the first to Nth stages;
   said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC,
   each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC,
   said Nth stage including a third sub ADC converting the sub analog signal provided from the preceding stage to the sub digital signal and providing the sub digital signal to said error correction circuit,
   said first sub DAC being configured to output the sub analog signal at a level within a predetermined output voltage range even if the level of said analog signal exceeds a predetermined input voltage range,
   said first stage further including an overflow detection circuit outputting an overflow detection signal in response to the level of said analog signal exceeding said predetermined input voltage range, said overflow detection circuit including
   a voltage-division circuit dividing a first voltage to generate a plurality of second voltages, and
   a comparator comparing a first level corresponding to said analog signal with a second level corresponding to a sum of said first voltage and said second voltage and outputting said overflow detection signal in response to said first level exceeding said second level, and
   said first sub DAC outputs the sub analog signal at a prescribed level within said predetermined output voltage range, in response to said overflow detection signal.

2. The pipeline A/D converter according to claim 1 wherein each of said analog signal and said sub analog signal is a differential signal.

3. A pipeline A/D converter converting an analog signal to a digital signal, comprising:
   first to Nth stages that are cascaded, where N is an integer not smaller than 2; and
   an error correction circuit generating said digital signal based on sub digital signals output from the first to Nth stages;
   said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC,
   each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC,
   said Nth stage including a third sub ADC converting the sub analog signal provided from the preceding stage to the sub digital signal and providing the sub digital signal to said error correction circuit,
   said first sub DAC is configured to output the sub analog signal at a level within a predetermined output voltage range even if the level of said analog signal exceeds a predetermined input voltage range,
   said first sub ADC includes
   a reference voltage generation circuit dividing a differential voltage between first and second voltages to generate first to nth reference voltages, where n is an integer not smaller than 2,
   first to nth comparators comparing the level of said analog signal with said first to nth reference voltages respectively, and
   an encoder outputting the sub digital signal based on a result of comparison by said first to nth comparators,
   said nth reference voltage represents an upper limit of said predetermined input voltage range,
   said first sub DAC outputs the sub analog signal based on the level of said analog signal and the result of comparison by said first to nth comparators, and
   a transfer function of said first stage has n turning points.

4. The pipeline A/D converter according to claim 3, wherein
   said first sub DAC includes
   first to nth capacitors provided in correspondence with said first to nth comparators respectively,
   a first switch provided in correspondence with each capacitor and providing said analog signal to one terminal of a corresponding capacitor during a first period,
   a second switch provided in correspondence with each capacitor and selectively providing any one voltage out of said first and second voltages to one terminal of the corresponding capacitor during a second period, based on a result of comparison by the corresponding comparator, and an amplifier having an input terminal connected to other terminals of said first to nth capacitors and outputting said sub analog signal.

5. The pipeline A/D converter according to claim 3, wherein said first stage further includes an overflow detection circuit outputting an overflow detection signal in response to the level of said analog signal exceeding the n+1th reference voltage higher than said first to nth reference voltages, and said first sub DAC outputs the sub analog signal at a prescribed level within said predetermined output voltage range, in response to said overflow detection signal.

6. The pipeline A/D converter according to claim 5, wherein said overflow detection circuit includes a comparator comparing a first level corresponding to said analog signal with a second level based on said first and second voltages and an output voltage of said reference voltage generation circuit and outputting said overflow detection signal in response to said first level exceeding said second level.

7. The pipeline A/D converter according to claim 3, wherein said n is 8.

8. The pipeline A/D converter according to claim 3, wherein said n is 4.

9. A pipeline A/D converter converting an analog signal to a digital signal, comprising:

first to Nth stages that are cascaded, where N is an integer not smaller than 2; and an error correction circuit generating said digital signal based on sub digital signals output from the first to Nth stages;

said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC, each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC, said Nth stage including a third sub ADC converting the sub analog signal provided from the preceding stage to the sub digital signal and providing the sub digital signal to said error correction circuit, said first sub DAC is configured to output the sub analog signal at a level within a predetermined output voltage range even if the level of said analog signal exceeds a predetermined input voltage range, a transfer function of said first stage includes six first turning points corresponding to first to sixth reference voltages for generating a signal of 2.75 bits among the sub digital signals output from said first sub ADC, respectively, and a second turning point corresponding to a seventh reference voltage higher than said first to sixth reference voltages for generating a signal of 0.25 bit among the sub digital signals output from said first sub ADC.

10. The pipeline A/D converter according to claim 9, wherein the transfer function of said first stage further includes a third turning point corresponding to an eighth reference voltage higher than said seventh reference voltage, and if the level of said analog signal is higher than said eighth reference voltage, the sub analog signal output from said first sub DAC is set to 0 level.

11. A pipeline A/D converter converting an analog signal to a digital signal, comprising:

first to Nth stages that are cascaded, where N is an integer not smaller than 2; and an error correction circuit generating said digital signal based on sub digital signals output from the first to Nth stages;

said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC, each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC, said Nth stage including a third sub ADC converting the sub analog signal provided from the preceding stage to the sub digital signal and providing the sub digital signal to said error correction circuit, said first sub DAC is configured to output the sub analog signal at a level within a predetermined output voltage range even if the level of said analog signal exceeds a predetermined input voltage range, a transfer function of said first stage includes two first turning points corresponding to first and second reference voltages for generating a signal of 1.5 bit among the sub digital signals output from said first sub ADC, respectively, and a second turning point corresponding to a third reference voltage higher than said first and second reference voltages for generating a signal of 0.5 bit among the sub digital signals output from said first sub ADC.

12. The pipeline A/D converter according to claim 11, wherein the transfer function of said first stage further includes a third turning point corresponding to a fourth reference voltage higher than said third reference voltage, and if the level of said analog signal is higher than said fourth reference voltage, the sub analog signal output from said first sub DAC is set to 0 level.

13. A pipeline A/D converter converting an analog signal to a digital signal, comprising:

first to Nth stages that are cascaded, where N is an integer not smaller than 2; and an error correction circuit generating said digital signal based on sub digital signals output from the first to Nth stages;

said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC, each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC, said Nth stage including a third sub ADC converting the sub analog signal provided from the preceding stage to the sub digital signal and providing the sub digital signal to said error correction circuit, said first sub DAC is configured to output the sub analog signal at a level within a predetermined output voltage range even if the level of said analog signal exceeds a predetermined input voltage range, each of said second to N−1th stages has a lateral shared amplifier configuration and includes a fourth sub ADC converting the sub analog signal provided from the preceding stage to the sub digital signal and providing the sub digital signal to said error correction circuit, and said second sub DAC outputs to the subsequent stage, the sub analog signal at a level in accordance with the sub analog signal provided from the preceding stage and the sub digital signal generated in said second sub ADC during a certain period, and outputs to the subsequent stage, the sub analog signal at a level in accordance with the sub analog signal provided from the preceding stage and the sub digital signal generated in said fourth sub ADC during a next period.

14. A pipeline A/D converter converting an analog signal to a digital signal, comprising:

first to Nth stages that are cascaded, where N is an integer not smaller than 2; and an error correction circuit generating said digital signal based on sub digital signals output from the first to Nth stages;

said first stage including a first sub ADC converting said analog signal to the sub digital signal and providing the sub digital signal to said error correction circuit and a first sub DAC outputting to said second stage, a sub analog signal at a level in accordance with said analog signal and the sub digital signal generated in said first sub ADC, each of said second to said N−1th stages including a second sub ADC converting the sub analog signal provided from a preceding stage to the sub digital signal and providing the sub digital signal to said error correction circuit and a second sub DAC outputting to a subsequent stage, a sub analog signal at a level in accordance with the sub analog signal provided from the preceding stage and the sub digital signal generated in said second sub ADC, said Nth stage including a third sub ADC converting the sub analog signal provided from the preceding stage to the sub digital signal and providing the sub digital signal to said error correction circuit, said first sub DAC is configured to output the sub analog signal at a level within a predetermined output voltage range even if the level of said analog signal exceeds a predetermined input voltage range, each of said second to N−1th stages has a vertical shared amplifier configuration and includes a fourth sub ADC converting the sub analog signal provided from said second sub DAC to the sub digital signal and providing the sub digital signal to said error correction circuit, and said second sub DAC outputs to said fourth sub ADC, the sub analog signal at a level in accordance with the sub analog signal provided from the preceding stage and the sub digital signal generated in said second sub ADC during a certain period, and outputs to the subsequent stage, the sub analog signal at a level in accordance with the generated sub analog signal and the sub digital signal generated in said fourth sub ADC during a next period.

* * * * *